US012292624B2

(12) United States Patent
Yu

(10) Patent No.: US 12,292,624 B2
(45) Date of Patent: May 6, 2025

(54) OPTOELECTRONIC DEVICE AND METHOD OF MANUFACTURING AN OPTOELECTRONIC DEVICE

(71) Applicant: ROCKLEY PHOTONICS LIMITED, Altrincham (GB)

(72) Inventor: Guomin Yu, Glendora, CA (US)

(73) Assignee: Rockley Photonics Limited, Altrincham (GB)

( * ) Notice: Subject to any disclaimer, the term of this patent is extended or adjusted under 35 U.S.C. 154(b) by 226 days.

(21) Appl. No.: 17/640,994

(22) PCT Filed: Sep. 4, 2020

(86) PCT No.: PCT/EP2020/074791
§ 371 (c)(1),
(2) Date: Mar. 7, 2022

(87) PCT Pub. No.: WO2021/048018
PCT Pub. Date: Mar. 18, 2021

(65) Prior Publication Data
US 2022/0342240 A1    Oct. 27, 2022

(30) Foreign Application Priority Data
Sep. 9, 2019   (GB) ..................... 1912975

(51) Int. Cl.
*G02F 1/025*    (2006.01)
*G02F 1/225*    (2006.01)
*H01L 31/0352*  (2006.01)
(52) U.S. Cl.
CPC ............ *G02F 1/025* (2013.01); *G02F 1/2257* (2013.01); *H01L 31/035281* (2013.01)
(58) Field of Classification Search
CPC ............................... G02F 1/025; G02F 1/2257
See application file for complete search history.

(56) References Cited

U.S. PATENT DOCUMENTS

| 6,298,177 B1 | 10/2001 | House |
| 7,085,443 B1 | 8/2006 | Gunn, III et al. |

(Continued)

FOREIGN PATENT DOCUMENTS

| CN | 103226252 A | 7/2013 |
| CN | 105511119 A | 4/2016 |

(Continued)

OTHER PUBLICATIONS

Gardes, F.Y. et al. "40 GB/s silicon photonics modulator for TE and TM polarisations", Optics Express, Jun. 2, 2011, pp. 11804-11814, vol. 19, No. 12, Optical Society of America.

(Continued)

*Primary Examiner* — Michelle R Connelly
*Assistant Examiner* — Kirsten D. Endresen
(74) *Attorney, Agent, or Firm* — Womble Bond Dickinson (US) LLP

(57) ABSTRACT

An optoelectronic device comprising an optical waveguide formed in a silicon device layer of a silicon-on-insulator wafer. The optical waveguide including a semiconductor junction comprising a first doped region of semiconductor material and a second doped region of semiconductor material. The second doped region containing dopants of a different species to the first doped region. A first portion of the first doped region extends horizontally on top of the second doped region, a second portion of the first doped region extends vertically along a lateral side of the second doped region and a third portion of the first doped region protrudes as a salient from the first or second portion of the first doped region into the second doped region.

18 Claims, 16 Drawing Sheets

(56) References Cited

U.S. PATENT DOCUMENTS

| | | |
|---|---|---|
| 7,251,408 B1 | 7/2007 | Gunn, III et al. |
| 7,672,553 B2 | 3/2010 | Gill et al. |
| 7,747,122 B2 | 6/2010 | Shetrit et al. |
| 8,693,811 B2 | 4/2014 | Morini et al. |
| 9,158,138 B2 | 10/2015 | Liu et al. |
| 9,343,638 B2 | 5/2016 | Gardes et al. |
| 9,448,425 B2 | 9/2016 | Ogawa et al. |
| 9,523,870 B2 | 12/2016 | Wei et al. |
| 9,612,459 B2 | 4/2017 | Feng et al. |
| 9,638,942 B2 | 5/2017 | Baehr-Jones et al. |
| 9,910,302 B2 | 3/2018 | Baehr-Jones et al. |
| 10,025,120 B2 | 7/2018 | Ayazi et al. |
| 10,082,686 B2 | 9/2018 | Baehr-Jones et al. |
| 10,133,142 B2 | 11/2018 | Doerr et al. |
| 10,146,070 B2 | 12/2018 | Fujikata et al. |
| 10,151,941 B2 | 12/2018 | Ishikura |
| 2010/0060970 A1 | 3/2010 | Chen |
| 2010/0080504 A1 | 4/2010 | Shetrit et al. |
| 2012/0257850 A1 | 10/2012 | Fujikata et al. |
| 2014/0341497 A1 | 11/2014 | Liu et al. |
| 2016/0313577 A1* | 10/2016 | Sun .................. G02F 1/025 |
| 2017/0102564 A1 | 4/2017 | Sakamoto et al. |
| 2017/0123239 A1 | 5/2017 | Ayazi et al. |
| 2017/0254955 A1 | 9/2017 | Poon et al. |
| 2018/0011347 A1 | 1/2018 | Ishikura |
| 2018/0059504 A1 | 3/2018 | Mekis et al. |
| 2018/0210242 A1 | 7/2018 | Baehr-Jones et al. |
| 2021/0373363 A1* | 12/2021 | Zhou .................. G02F 1/0151 |

FOREIGN PATENT DOCUMENTS

| | | | |
|---|---|---|---|
| CN | 106154680 A | 11/2016 | |
| EP | 3264166 A1 * | 1/2018 | ............. G02F 1/025 |

OTHER PUBLICATIONS

International Search Report and Written Opinion of the International Searching Authority, mailed Nov. 17, 2020, corresponding to PCT/EP2020/074791 4 pages.

U.K. Intellectual Property Office Examination Report, dated Nov. 30, 2022 for Patent Application No. GB1912975.8, 6 pages.

U.K. Intellectual Property Office Search Report, dated Mar. 5, 2020 for Patent Application No. GB1912975.8, 3 pages.

Chinese Notification and partial English translation of the First Office Action, for Patent Application No. 202080063642.X, mailed Mar. 10, 2025, 22 pages.

* cited by examiner

OPTOELECTRONIC DEVICE AND METHOD OF MANUFACTURING AN OPTOELECTRONIC DEVICE

CROSS-REFERENCE TO RELATED APPLICATION(S)

This application is a U.S. national stage entry, under 35 U.S.C. § 371, of International Application Number PCT/EP2020/074791, filed on Sep. 4, 2020, which claims priority to British Patent Application Number 1912975.8, filed Sep. 9, 2019. The entire contents of all of the applications identified in this paragraph are incorporated herein by reference.

FIELD

One or more aspects of embodiments according to the present invention relate to an optoelectronic device, and more particularly to an optoelectronic device comprising a silicon-on-insulator wafer.

BACKGROUND

Optical modulation of light in a silicon waveguide is known, including waveguide modulators based upon: electro-optic, quantum confined Stark, Franz-Keldysh, and carrier plasma dispersion.

Waveguide modulators can include silicon, III-V type materials, other semiconductors, and polymer waveguides. They are typically symmetrical structures, although doped areas may not be symmetrical. For example, U.S. Pat. No. 7,085,443 proposes a PN phase shift modulator in which the doping of silicon is asymmetric across the waveguide.

A major factor of determining silicon PN junction phase shifter modulation efficiency is the extent of overlap between the optical mode and the PN junction area. Specifically, it is possible to improve the modulation efficiency of a silicon phase shifter by increasing the overlap between the optical mode and the PN junction area.

SUMMARY

The present invention aims to improve the modulation efficiency of an optoelectronic device. Specifically, according to a first aspect, embodiments of the present invention provide an optoelectronic device comprising:
  an optical waveguide formed in a silicon device layer of a silicon-on-insulator wafer, the optical waveguide including a semiconductor junction comprising:
    a first doped region of semiconductor material; and
    a second doped region of semiconductor material, the second doped region containing dopants of a different species to the first doped region, wherein:
    a first portion of the first doped region extends horizontally on top of the second doped region;
    a second portion of the first doped region extends vertically along a lateral side of the second doped region; and
    a third portion of the first doped region protrudes as a salient from the first or second portion of the first doped region into the second doped region.

The silicon-on-insulator, SOI, wafer comprises a silicon substrate, a buried oxide (BOX) layer on top of the silicon substrate, and the silicon device layer (i.e. a top silicon layer) on top of the BOX layer. As used herein, the terms "vertically" and "horizontally" are to be understood as relative to the BOX layer such that "vertically" is perpendicular to the upper surface of the BOX layer, and "horizontally" relates to a direction which lies within any plane that is parallel to the plane which lies along the upper surface of the BOX layer.

According to this aspect, the semiconductor junction between the first and second doped regions has an increased length in an optical mode area of the waveguide so that the overlap between the optical mode and the junction is increased. Therefore, the modulation efficiency of the optoelectronic device is improved.

Optional features of the invention will now be set out. These are applicable singly or in any combination with any aspect of the invention.

It is to be understood that a salient may be something that projects outwards/inwards or upwards/downwards from its surroundings. Accordingly, by protruding as a salient from the first or second portion of the first doped region into the second doped region, the third portion of the first doped region may be surrounded by the second doped region on all but one side of the third portion of the first doped region (i.e. surrounded by the second doped region on all sides but the side from which it extends from the first/second portion of the first doped region). Specifically, opposing sides of the third portion of the first doped region may be contiguous with the second doped region. The third portion of the first doped region may therefore forms a salient/peninsula extending into the second doped region.

Specifically, the first portion of the first doped region may extend between its respective ends, the second portion of the first doped region may extend between its respective ends, and the third portion of the first doped region may protrude from a point in-between the ends of either the first or second portion of the first doped region. In other words, the third portion does not extend from an end of the first or second portion of the first doped region.

In this way, the first, second, and third portions of the first doped region together may resemble the English letter "F".

The first doped region may have an opposite doping type to the second doped region. For example, the first doped region may be a p-type doped region, and the second doped region may be an n-type doped region, or vice versa. Accordingly, the semiconductor junction between the first and second doped regions may be a p-n junction.

Optionally, the first portion of the first doped region may extend horizontally on top of the entire upper surface of the second doped region.

The second portion of the first doped region may extend vertically between an end of the first portion of the first doped region and the BOX layer.

Optionally, the optoelectronic device may comprise a ridge waveguide having a ridge region and two laterally-extending slab regions.

In some embodiments, the third portion of the first doped region may protrude horizontally into the second doped region from the second portion of the first doped region. The third portion of the first doped region may have a hemi-cylindrical geometry, (semicircular when viewed in cross-section) where a flat surface of the third portion is adjacent to the second doped region, and the curved surface of the third portion is adjacent to the second doped region.

In this way, the second doped region extends on top of, and below, the third portion of the first doped region. The second doped region also extends vertically along a lateral side of the third portion of the first doped region.

In these embodiments, the third portion of the first doped region may protrude into the second doped region from a mid-point of the second portion of the first doped region (i.e. from a point mid-way between the two ends of the second portion of the first doped region).

Optionally, a length of the first doped region (i.e. the distance between its two ends), may be greater than the distance by which the third portion of the first doped region protrudes horizontally into the second doped region.

In alternative embodiments, the third portion of the first doped region may protrude vertically into the second doped region from the first portion of the first doped region. In these embodiments, the third portion of the first doped region protrudes vertically downwards from the upper surface of the optical waveguide towards the BOX layer of the SOI wafer.

In this way, the second doped region extends vertically on either lateral side of the third portion of the first doped region. The second doped region also extends below the third portion of the first doped region.

In these embodiments, the third portion of the first doped region may protrude into the second doped region from a mid-point of the first portion of the first doped region (i.e. from a point mid-way between the two ends of the first portion of the first doped region).

Optionally, a length of the second doped region (i.e. the distance between its two ends), may be greater than the distance by which the third portion of the first doped region protrudes vertically downwards into the second doped region.

In some embodiments, the optoelectronic device may further comprise a first heavily doped region (e.g. n+, p+). The first heavily doped region may be formed outside of a light propagation region of the optical waveguide. A light propagation region of the optical waveguide is a spatial region in which light is restricted to propagate, and is positioned in the ridge region of the optoelectronic device. The first heavily doped region may be formed in a slab region of the optoelectronic device.

Similarly, the optoelectronic device may further comprise a second heavily doped region (e.g. n+, p+). The second heavily doped region may be formed outside the light propagation region of the optical waveguide. The second heavily doped region may be formed in a slab region of the optoelectronic device. The second heavily doped region may contain dopants of a different species to the first heavily doped region.

The first heavily doped region may contain dopants of the same species as the first doped region, but may have a higher concentration of dopants than the first doped region (i.e. be more heavily doped than the first doped region). The second heavily doped region may contain dopants of the same species as the second doped region, but may have a higher concentration of dopants than the second doped region (i.e. be more heavily doped than the second doped region).

An extension of the first doped region may extend from the light propagation region of the optical waveguide (i.e. from the second portion of the first doped region) to the first heavily doped region outside of the light propagation region. An extension of the second doped region may extend from the light propagation region of the optical waveguide to the second heavily doped region in a slab region.

Specifically, the extension of the first doped region may extend horizontally from the light propagation region of the optical waveguide to the first heavily doped region. Similarly, the extension of the second doped region may extend horizontally from the light propagation region of the optical waveguide to the second heavily doped region. The respective extensions of the first and second doped regions may extend horizontally on top of, and contiguously with, the BOX layer of the SOI wafer.

Optionally, the optoelectronic device may further comprise a first electrical contact electrically connected to the first heavily doped region, and a second electrical contact electrically connected to the second heavily doped region. The first and second electrical contacts may comprise aluminium, for example.

In some embodiments, the optoelectronic device may further comprise a passivation layer on top of the optical waveguide. In these embodiments, the first and second electrical contacts may extend through the passivation layer to electrically contact the first and second heavily doped regions, respectively. The passivation layer may comprise silicon dioxide, for example.

There is also disclosed a method of manufacturing the optoelectronic device of the first aspect. Specifically, according to a second aspect, there is provided a method of manufacturing an optoelectronic device having an optical waveguide formed in a silicon device layer of a silicon-on-insulator wafer, the optical waveguide of the manufactured optoelectronic device including a junction between:
a first doped region of semiconductor material; and
a second doped region of semiconductor material, the second doped region containing dopants of a different species to the first doped region, wherein the method comprises the steps of:
creating a first portion of the first doped region, the first portion of the first doped region extending horizontally on top of the second doped region;
creating a second portion of the first doped region, the second portion of the first doped region extending vertically along a lateral side of the second doped region; and
creating a third portion of the first doped region, wherein, in the manufactured optoelectronic device, the third portion of the first doped region protrudes as a salient from the first or second portion of the first doped region into the second doped region.

Similarly to the first aspect, the silicon-on-insulator, SOT, wafer comprises a silicon substrate (i.e. silicon base layer), a buried oxide (BOX) layer on top of the silicon substrate, and the silicon device layer (i.e. top silicon layer) on top of the BOX layer. As used herein, the terms "vertically" and "horizontally" are to be understood as relative to the BOX layer such that "vertically" is perpendicular to the upper surface of the BOX layer, and "horizontally" relates to a direction which lies within any plane that is parallel to the plane which lies along the upper surface of the BOX layer.

As mentioned above, a salient may be something that projects outwards/inwards or upward/downwards from its surroundings. Thus, by protruding as a salient from the first or second portion of the first doped region into the second doped region, the third portion of the first doped region may be surrounded by the second doped region on all but one side of the third portion of the first doped region (i.e. surrounded by the second doped region on all sides but the side from which it extends from the first/second portion of the first doped region). Specifically, opposing sides of the third portion of the first doped region may be contiguous with the second doped region. The third portion of the first doped region may therefore form a salient/peninsula extending into the second doped region.

Specifically, the first portion of the first doped region may extend between its respective ends, the second portion of the first doped region may extend between its respective ends, and the third portion of the first doped region may protrude from a point in-between the ends of either the first or second portion of the first doped region. In other words, the third portion does not extend from an end of the first or second portion of the first doped region.

In this way, the first, second and third portions of the first doped region may be created in order to resemble the English letter "F".

Further optional features are set out below.

Similarly, to the first aspect, the first doped region may have an opposite doping type to the second doped region. For example, the first doped region may be a p-type doped region, and the second doped region may be an n-type doped region, or vice versa. Accordingly, the semiconductor junction between the first and second doped regions may be a p-n junction.

Optionally, the step of creating a third portion of the first doped region comprises:
 depositing a first mask layer on the silicon device layer;
 creating an opening in the first mask layer to the silicon device layer; and
 introducing a first dopant to the silicon device layer through the opening in the first mask layer.

Accordingly, the opening in the first mask layer provides a pattern for the introduction of the first dopant to the silicon device layer.

The first dopant may be introduced to the silicon device layer to create the third portion of the first doped layer by diffusion of the first dopant, or by implantation of the first dopant (this may depend on the thickness of the silicon device layer of the SOI wafer).

The first doped region may be p-type doped. In these embodiments, the first dopant may be boron. In this way, the third portion of the first doped region may be created by boron diffusion, or boron implantation.

In alternative embodiments, the first doped region may be n-type doped. In these embodiments, the first dopant may be phosphorous, for example.

The first mask layer may comprise silicon dioxide, for example. The thickness of the first mask layer may be approximately 500 nm, for example.

Optionally, the steps of creating a first and second portion of the first doped region may be carried out in a single process step. For example, the steps of creating a first and second portion of the first doped regions may comprise:
 depositing a second mask layer on the optical waveguide; and
 introducing the first dopant to the optical waveguide through the second mask layer.

The first dopant may be introduced by implantation. Specifically, to create the first and second portions of the first doped regions, the first dopant may be introduced by implantation at an angle less than 90° from the horizontal (wherein, as mentioned above, the horizontal is a direction which lies within any plane that is parallel to the plane which lies along the upper surface of the BOX layer). In some embodiments, the first dopant may be introduced by implantation at an angle of 45° relative to the horizontal.

By implantation at less than 90° relative to the horizontal, the first and second portions of the first doped region may be created in the optical waveguide in a single process step, wherein the first portion of the first doped region extends horizontally on top of the second doped region, and the second portion of the first doped region extends vertically along a lateral side of the second doped region.

Optionally, the second mask layer may comprise silicon dioxide, for example. The thickness of the first mask layer may be approximately 20-50 nm, for example.

The method may further comprise:
 depositing a waveguide mask layer on the silicon device layer of the SOI wafer; and
 etching a portion of the silicon device layer of the SOI wafer to form the optical waveguide.

The waveguide mask layer may be silicon nitride or silicon dioxide, and may have a thickness of approximately 500 nm, for example. The waveguide mask layer may provide a pattern for etching the portion of the silicon device layer to form the optical waveguide.

The step of etching a portion of the silicon device layer to form the optical waveguide may be performed after the step of creating a third portion of the first doped region by introducing the first dopant to the silicon device layer. In these embodiments, the silicon device layer is etched such that the resulting optical waveguide comprises the third portion of the first doped region, the third portion of the first doped region protruding vertically downwards from an upper surface of the optical waveguide (i.e. an upper surface of the ridge region).

Alternatively, the step of etching a portion of the silicon device layer to form the optical waveguide may be performed as a two-stage process. Specifically, in the first stage, a portion of the silicon device layer may be etched to form a part-formed optical waveguide. The part-formed optical waveguide may be etched to a partial depth which is less than a final depth of the optical waveguide.

In these embodiments, the step of creating a third portion of the first doped region may then be performed by:
 depositing the first mask layer on the part-formed optical waveguide;
 creating an opening in the first mask layer to the part-formed optical waveguide; and
 introducing a first dopant to the part-formed waveguide through the opening in the first mask layer.

After introducing the first dopant to the part-formed optical waveguide, the second etching stage may be performed to form the optical waveguide to its full depth. Specifically, in this second stage, the etched portion of the silicon device layer is etched further such that the optical waveguide is formed from the part-formed optical waveguide. The optical waveguide is etched to its full depth, from the first depth of the part-formed optical waveguide.

In this way, the third portion of the first doped region may be protrude horizontally from a lateral side of the optical waveguide from a point which is at neither opposing end of the lateral side of the ridge portion of the optical waveguide. This will result in the "F" shape of the collective first, second and third portions of the first doped region.

The second doped region may be provided by the silicon device layer of the SOI wafer. Accordingly, the silicon device layer of the SOI wafer may contain dopants of a different species to the first doped region. The silicon device layer may have an opposite doping type to the first doped region. For example, the silicon device layer may be p-type or n-type doped prior to the introduction of the first dopant to create the first doped region.

The SOI wafer may be a 3 μm wafer, for example.

Optionally, the method may further comprise:
 creating a first heavily doped region outside of a light propagation region of the optical waveguide, the first heavily doped region containing dopants of the same species as the first doped region; and creating a second heavily doped region outside of the light propagation region of the optical waveguide, the second heavily doped region containing dopants of the same species as the second doped region.

In these embodiments, the first heavily doped region is more heavily doped (i.e. has a higher concentration of dopants) than the first doped region, and the second heavily doped region is more heavily doped than the second doped region. For example, if the first doped region is p-type doped, the first heavily doped region may be p+ doped, and if the second doped region is n-type doped, the second heavily doped region may be n+ doped.

Optionally, the step of creating the first heavily doped region may comprise introducing the first dopant to a region of the silicon device layer of the SOI wafer outside of the light propagation region of the optical waveguide. Specifically, the first dopant may be introduced to a slab region of the optoelectronic device. The first dopant may be introduced by implantation of the first dopant. As discussed above, the first dopant may be boron or phosphorous.

The step of creating the second heavily doped region may comprise introducing a second dopant to a region of the silicon device layer of the SOI wafer outside of the light propagation region of the optical waveguide, the second dopant being different, and optionally having an opposite doping type, to the first dopant. Specifically, the second dopant may be introduced to a slab region of the optoelectronic device. The second dopant may be introduced by implantation of the second dopant.

The second dopant may be phosphorous or boron, for example. In embodiments in which the first dopant is boron, the second dopant may be phosphorous.

The method may further comprise annealing the optical waveguide. The optical waveguide may be annealed at 1050-1100° C. for 10 seconds, for example.

Optionally, the method may further comprise:
depositing a passivation layer on the optical waveguide;
applying a first electrical contact through the passivation layer to the first heavily doped region; and
applying a second electrical contact through the passivation layer to the second heavily doped region.

The passivation layer may comprise silicon dioxide, for example. The thickness of the passivation layer may be 500 nm. The first and second electrical contacts may comprise aluminium, for example.

According to a third aspect, there is provided a method of manufacturing an optoelectronic waveguide formed in a silicon device layer of a silicon-on-insulator wafer, the silicon device layer providing a second doped region of semiconductor material, wherein the method comprises the steps of:
etching a portion of the silicon device layer of the silicon-on-insulator wafer to a first depth which is less than a final depth of the optical waveguide, to form a part-formed optical waveguide;
creating a third portion of a first doped region in the part-formed optical waveguide, the first doped region containing dopants of a different species to the first doped region;
further etching the part-formed optical waveguide to form the optical waveguide at its full depth;
creating a first portion of the first doped region in the optical waveguide, the first portion of the first doped region extending horizontally on top of the second doped region; and
creating a second portion of the first doped region in the optical waveguide, the second portion of the first doped region extending vertically along a lateral side of the second doped region, wherein the third portion of the first doped region protrudes as a salient from the first or second portion of the first doped region into the second doped region.

According to a fourth aspect, there is provided a method of manufacturing an optoelectronic waveguide formed in a silicon device layer of a silicon-on-insulator wafer, the silicon device layer providing a second doped region of semiconductor material, the method comprising the steps of:
creating a third portion of a first doped region in the silicon device layer, the first doped region containing dopants of a different species to the first doped region;
etching a portion of the silicon device layer to form the optical waveguide;
creating a first portion of the first doped region in the optical waveguide, the first portion of the first doped region extending horizontally on top of the second doped region;
creating a second portion of the first doped region in the optical waveguide, the second portion of the first doped region extending vertically along a lateral side of the second doped region, wherein the third portion of the first doped region protrudes as a salient from the first or second portion of the first doped region into the second doped region.

According to a fifth aspect, there is provided a method of manufacturing the optoelectronic device of the first aspect.

According to a sixth aspect, there is provided a Mach-Zehnder interferometer, usable as an electro-optic modulator, the interferometer including a pair of waveguides, each waveguide containing an optoelectronic device according to the first aspect.

The disclosure includes the combination of the aspects and optional features described above except where such a combination is clearly impermissible or expressly avoided.

BRIEF DESCRIPTION OF THE DRAWINGS

Embodiments of the invention will now be described by way of example with reference to the accompanying drawings in which.

DETAILED DESCRIPTION

The detailed description set forth below in connection with the appended drawings is intended as a description of exemplary embodiments of an optoelectronic device and its method of manufacture provided in accordance with the present invention and is not intended to represent the only forms in which the present invention may be constructed or utilized.

A method of manufacturing an optoelectronic device according to a first embodiment is described below with reference to FIGS. 1a-1r. The resultant manufactured device is illustrated in FIG. 2. The manufactured optoelectronic device 1 comprises a ridge waveguide having a ridge region 2, and two laterally-extending slab regions 3. The optoelectronic device 1 comprises a SOI wafer 20.

Figure 1A:
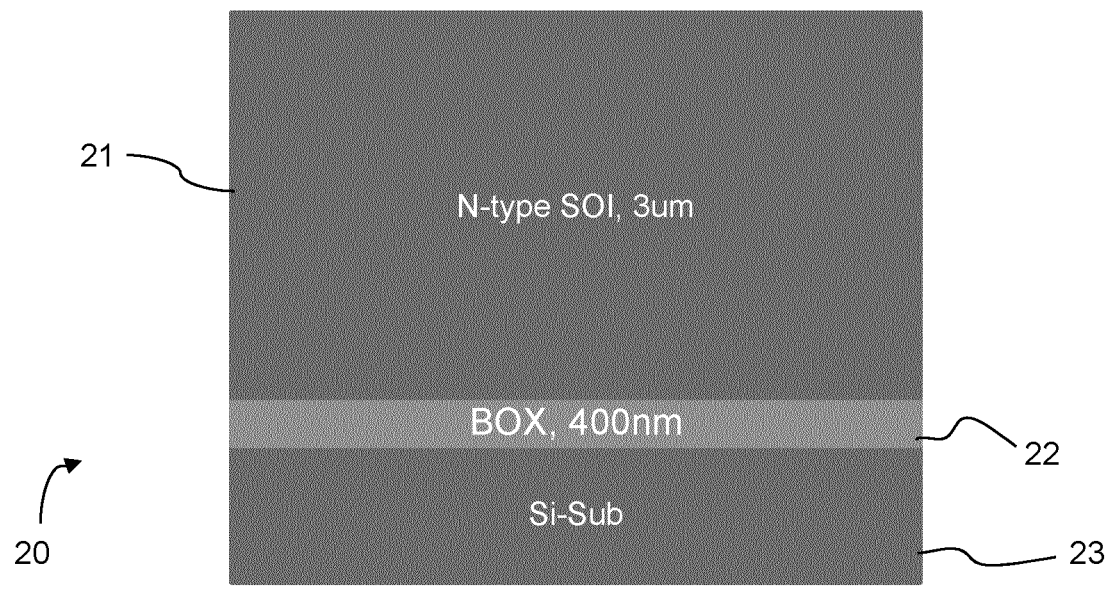
FIGS. 1a-1r depict steps of a method of manufacturing an optoelectronic device according to a first embodiment of the invention.
Figure 2:
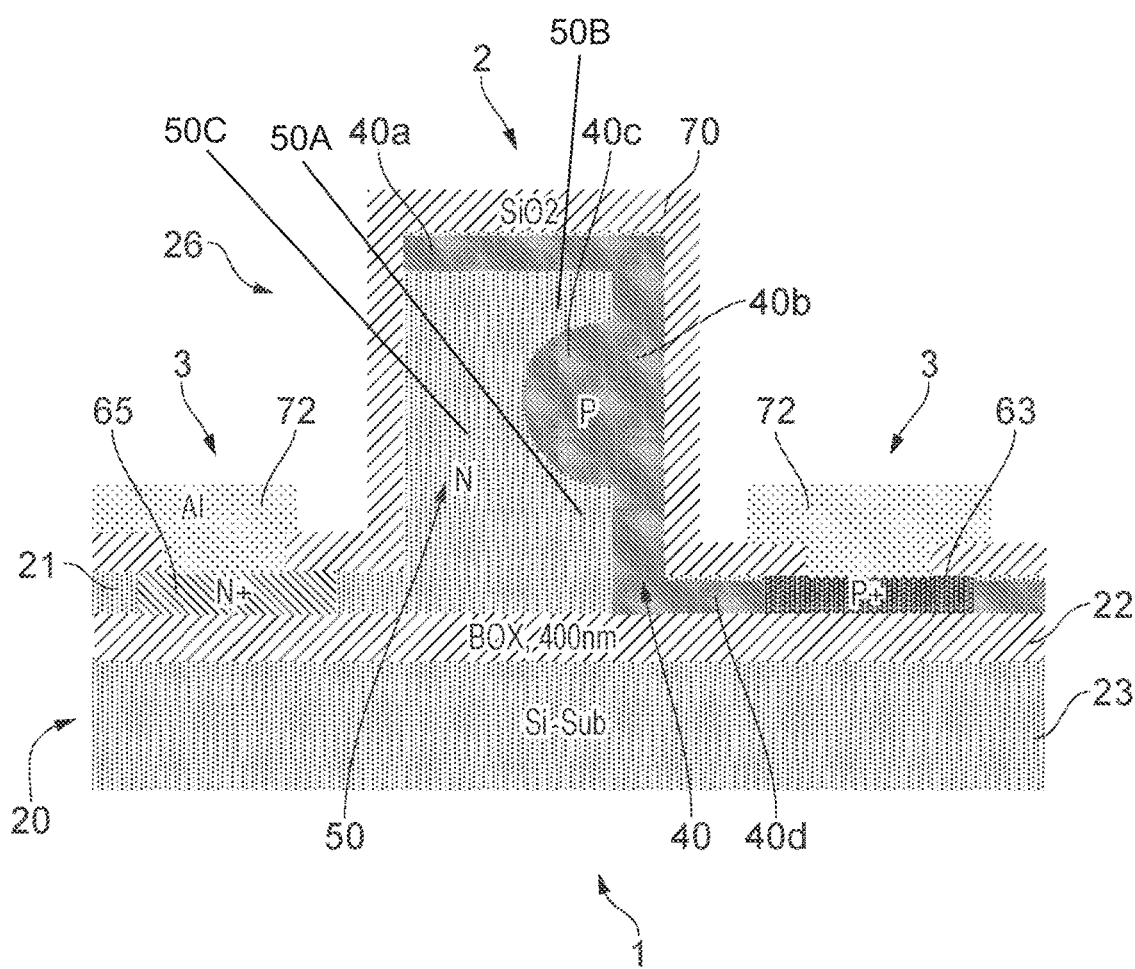
FIG. 2 is a schematic cross-section of the optoelectronic device manufactured according to the method depicted in FIGS. 1a-1r.

As shown in FIG. 1a, the SOI wafer 20 is initially provided comprising a silicon substrate 23 (i.e. silicon base layer), a buried oxide (BOX) layer 22 and a silicon device layer 21 (i.e. silicon device layer). The SOI wafer 20 is a 3 µm wafer, and the BOX layer 22 has a thickness, as measured from an upper surface of the substrate 23 to an upper surface of the BOX layer 22, of 400 nm. The silicon device layer 21 is n-type doped, and will form a second doped region of a p-n junction of the optoelectronic device 1. Alternatively, an undoped silicon device layer 21 can be provided, which is then doped with an n species dopant.

Figure 1B:
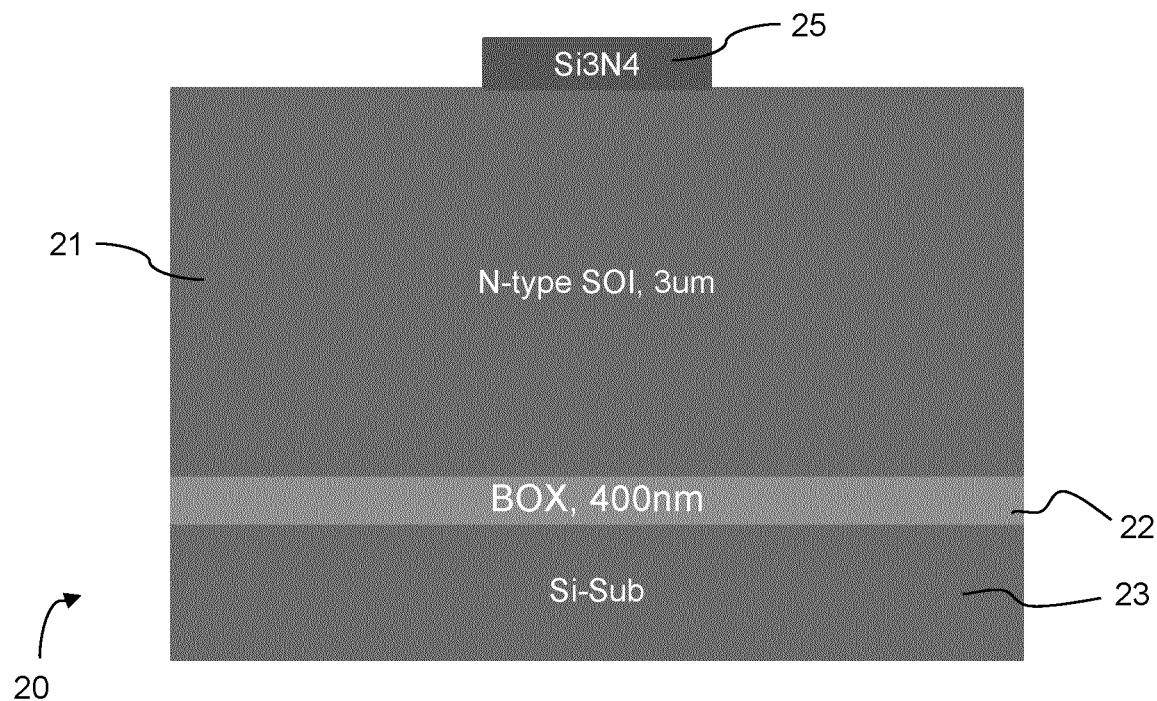

In FIG. 1B, a waveguide mask 25 is deposited on the silicon device layer 21. The waveguide mask 25 comprises silicon nitride, preferably $Si_3N_4$, and has a thickness of 500 nm. The waveguide mask 25 is patterned to define an optical waveguide. Specifically, the waveguide mask 25 is deposited, and a photolithography process used to pattern the mask so as to define the optical waveguide. Standard deposition techniques are used.

Figure 1C:
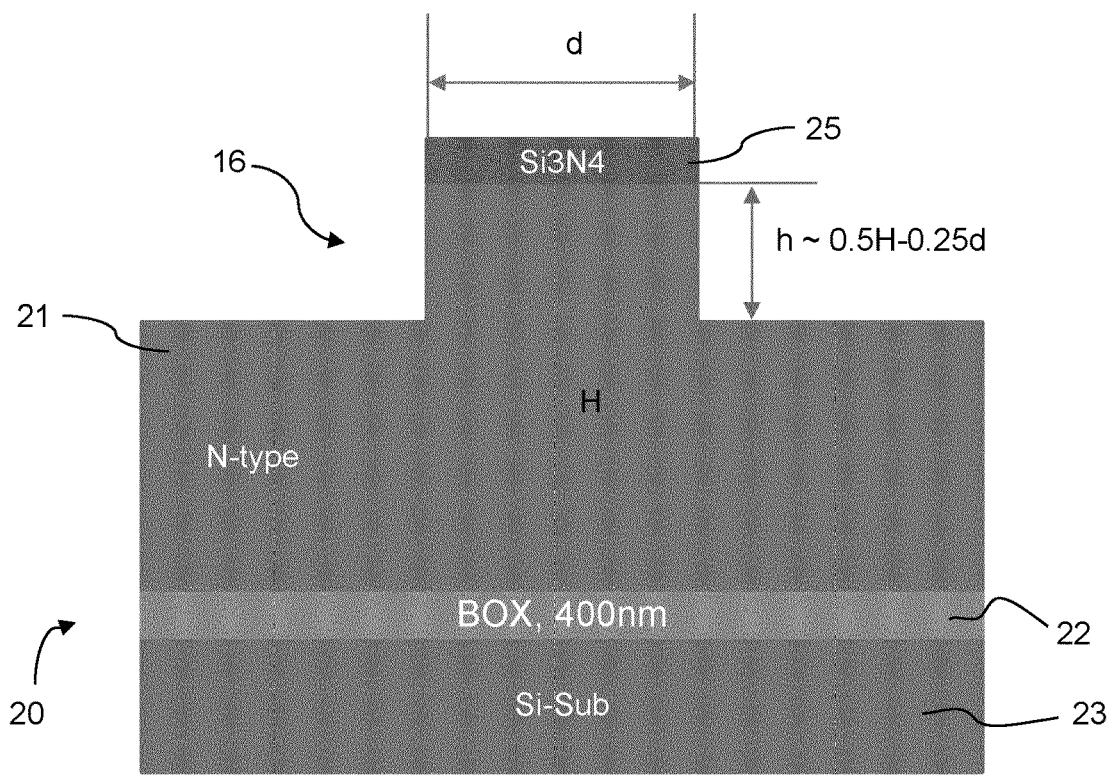

Next, as shown in FIG. 1c, a first stage of a two-stage etching process is performed. Specifically, a part-formed optical waveguide 16 is etched in the silicon device layer 21. A height of the silicon device layer 21 before etching the part-formed optical waveguide 16 is indicated as H in FIG. 1c. The part-formed optical waveguide 16 is etched in the silicon device layer 21 to a depth h. Depth, h is in the range of 0.5H-0.25 d, wherein d is the width of the part-formed optical waveguide 16 as defined by the mask 25. The part-formed optical waveguide 16 may be etched using standard patterning and etching techniques.

Figure 1D:
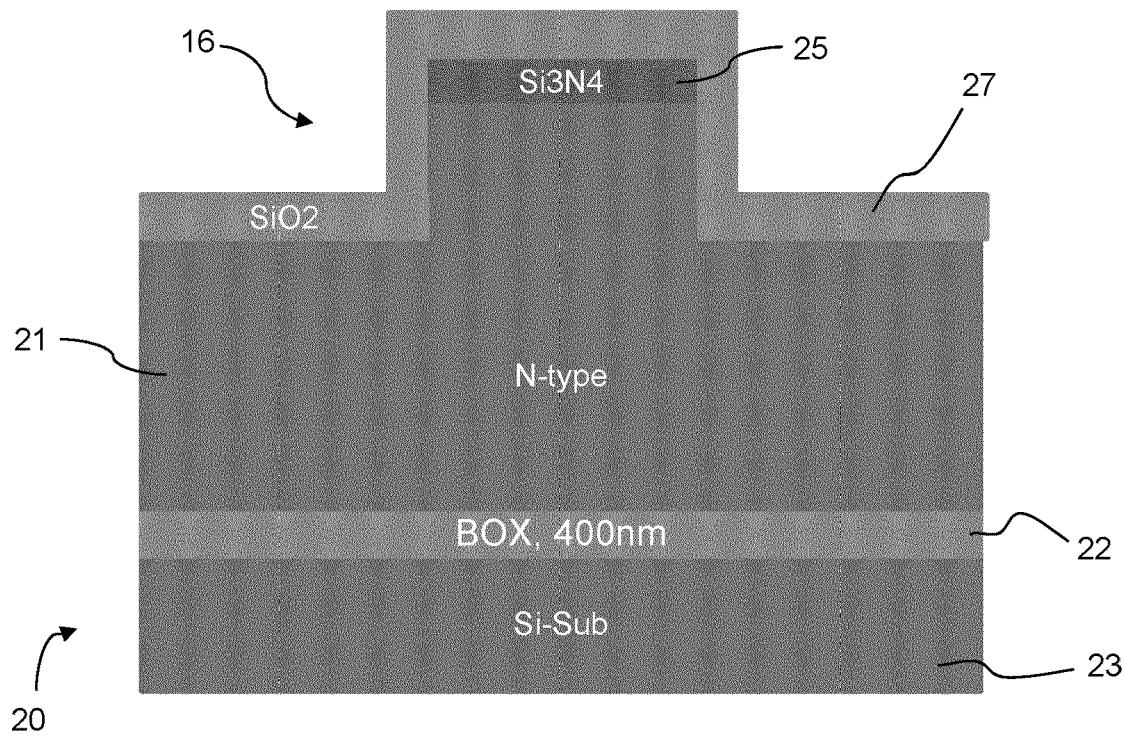

In FIG. 1d, a first mask layer 27 is deposited on the part-formed optical waveguide 16 and the silicon device layer 21 of the SOI wafer 20. The first mask layer 27 comprises silicon dioxide and has a thickness of approximately 500 nm.

Figure 1E:
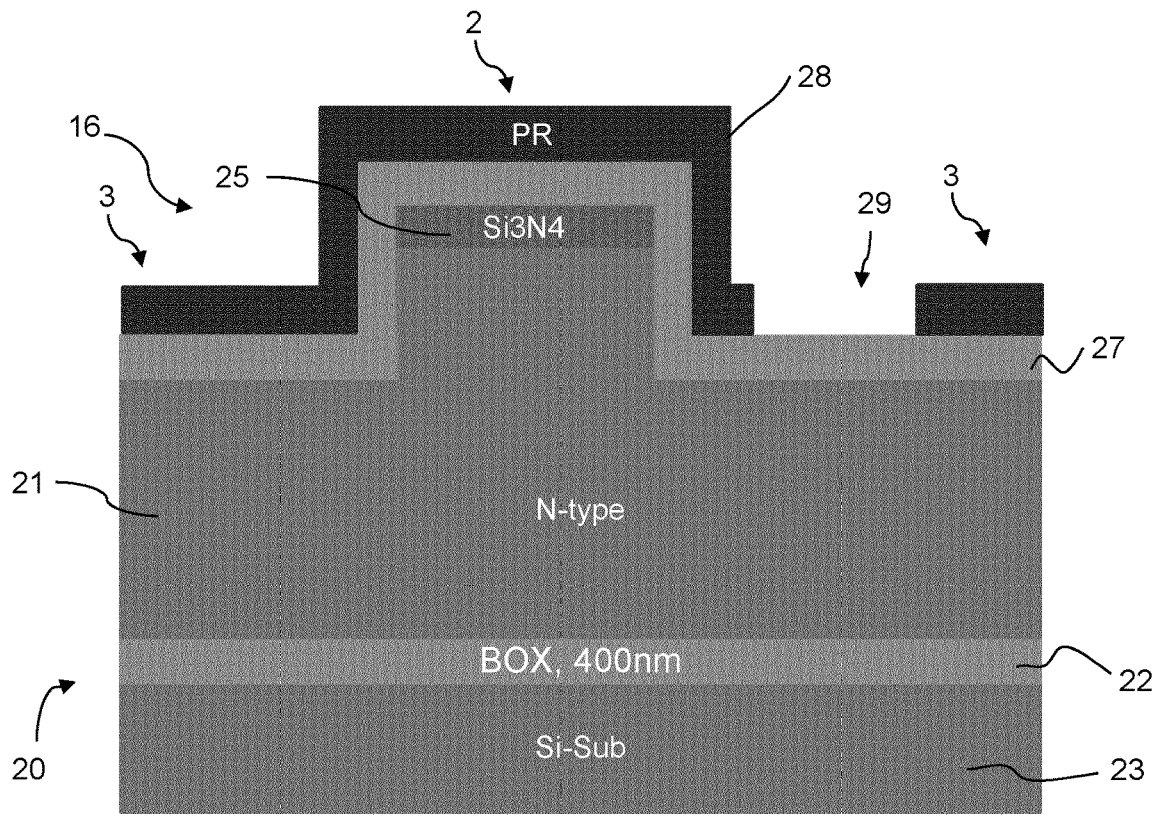

Next, a photoresist 28 is positioned on the first mask layer 27 (FIG. 1e) and patterned to define an opening in the first mask layer 27. The photoresist 28 has a window 29 therethrough, such that a portion of the first mask layer 27 is exposed. The window 29 is positioned over a part of the silicon device layer 21 with a reduced height (i.e. a part of the silicon device layer 21 that has been etched away). In this way, the window 29 is positioned over a slab region 3 (a region of the silicon device layer 21 outside of a light propagation region).

Figure 1F:
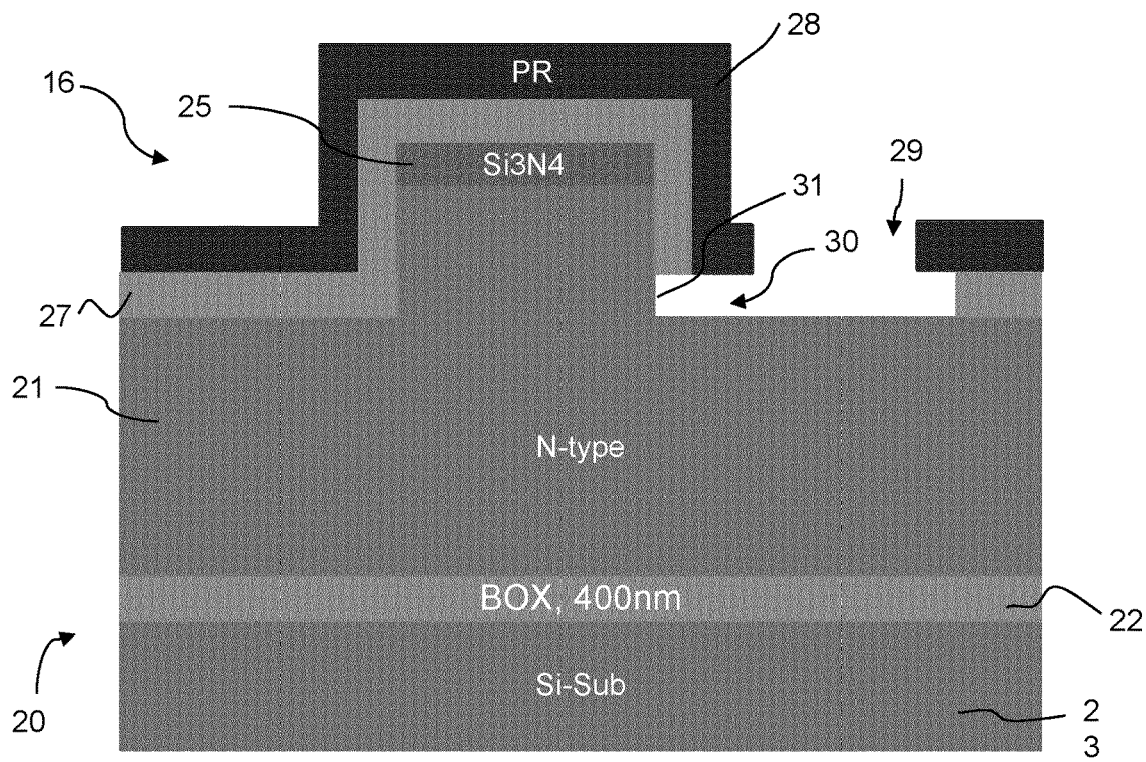

In FIG. 1f, an opening 30 is created in the first mask layer 27 to the part-formed optical waveguide 16. The opening 30 in the first mask layer 27 is created by HF wet etching (i.e. wet etching using hydrofluoric acid). The opening 30 extends to a lateral side 31 of the part-formed optical waveguide 16, in that the wet etch intentionally over etches the first mask layer 27. The photoresist 28 is then removed.

Figure 1G:
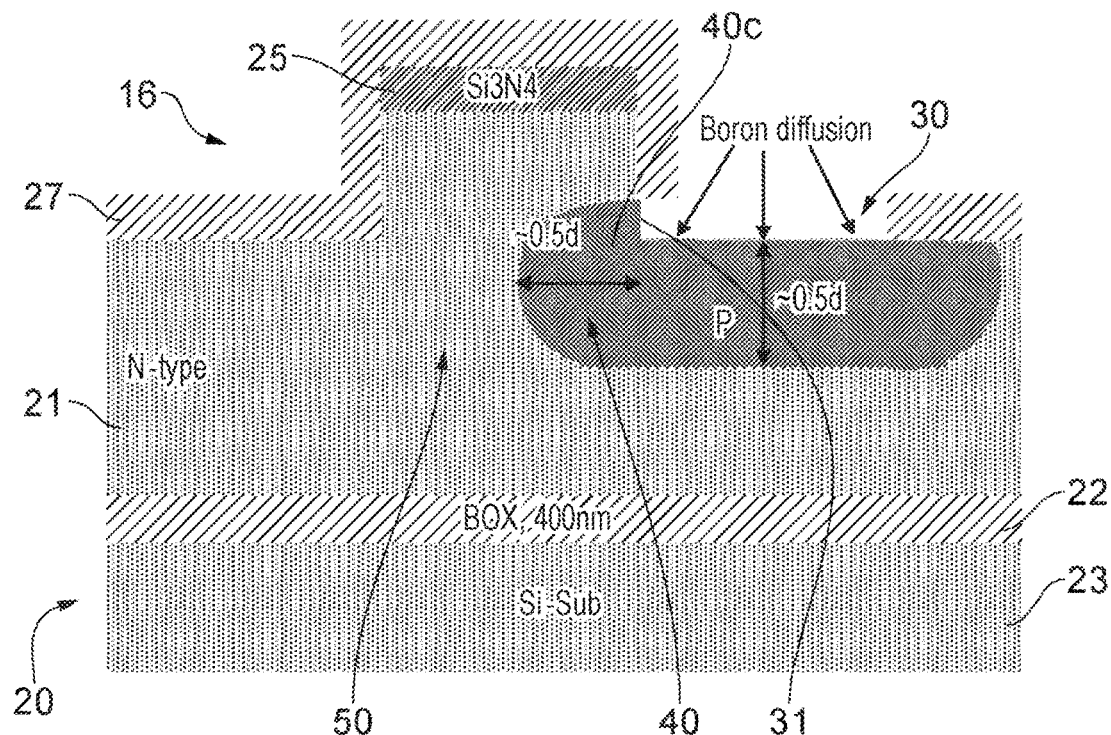

As shown in FIG. 1g, a first dopant (e.g. boron) is introduced by diffusion through the opening 30 in the first mask layer 27 to the part-formed optical waveguide 16, thereby creating the third portion 40c of a first doped region 40 referred to above. The first doped region 40 is p-type doped. The third portion 40c of the first doped region 40 protrudes horizontally into a second doped region 50, which is formed by the silicon device layer 21. The third portion 40c of the first doped region 40 protrudes from a lateral side 31 of the optical waveguide 26 by a distance of approximately 0.5 d (i.e. half the width of the optical waveguide 16). As shown in FIG. 1g, some of the first dopant will also diffuse downwards towards the BOX layer 22. This dopant-diffused region will extend downwards by a distance of approximately 0.5 d.

In alternative embodiments, rather than introduction of the first dopant by diffusion, the first dopant may be introduced by implantation.

Figure 1H:
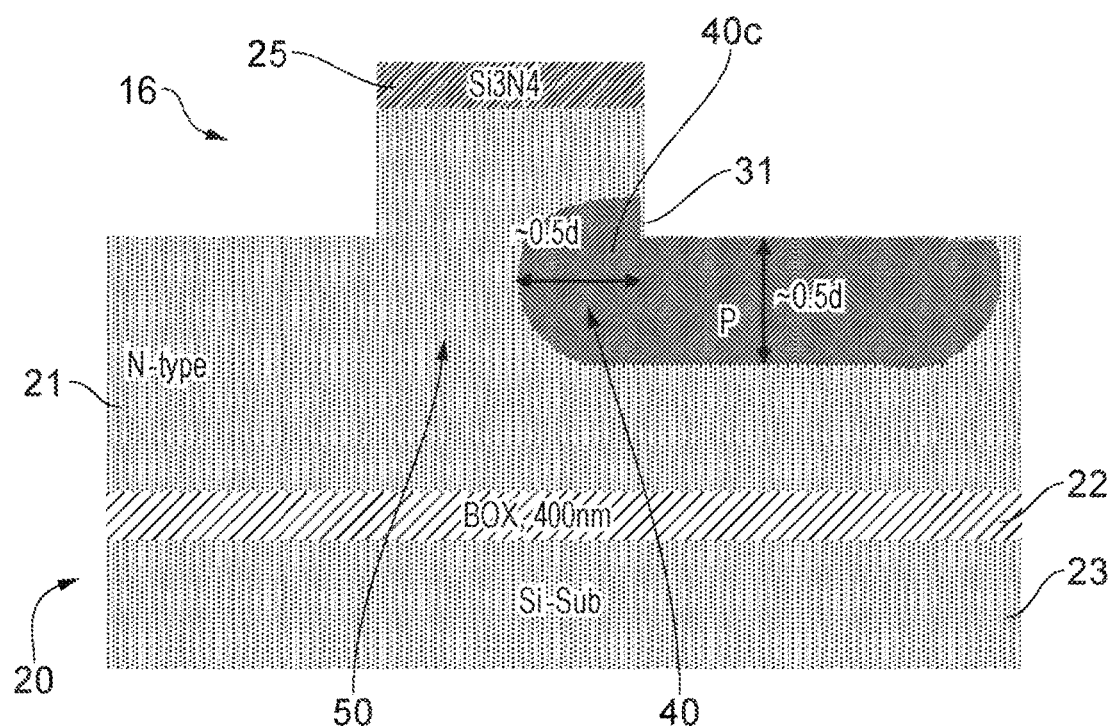

In FIG. 1h, the first mask layer 27 is removed, but the waveguide mask 25 is maintained on the optical waveguide 16.

Figure 1I:
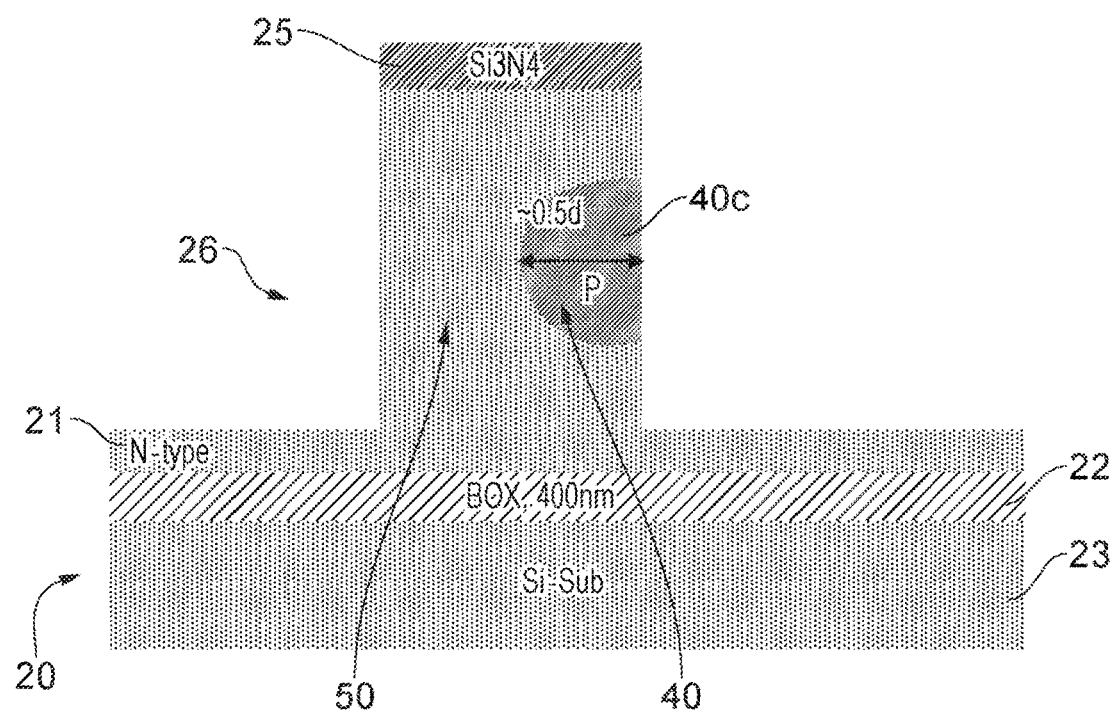

Next, a second etching stage is performed, against using the waveguide mask 25 (FIG. 1i). Standard etching techniques are used to etch an optical waveguide 26 to its full depth with self-alignment relative to the part-formed waveguide. Specifically, the etched portion of the silicon device layer 21 is etched further to form the optical waveguide 26 to its full depth, from the part-formed optical waveguide 16.

Figure 1J:
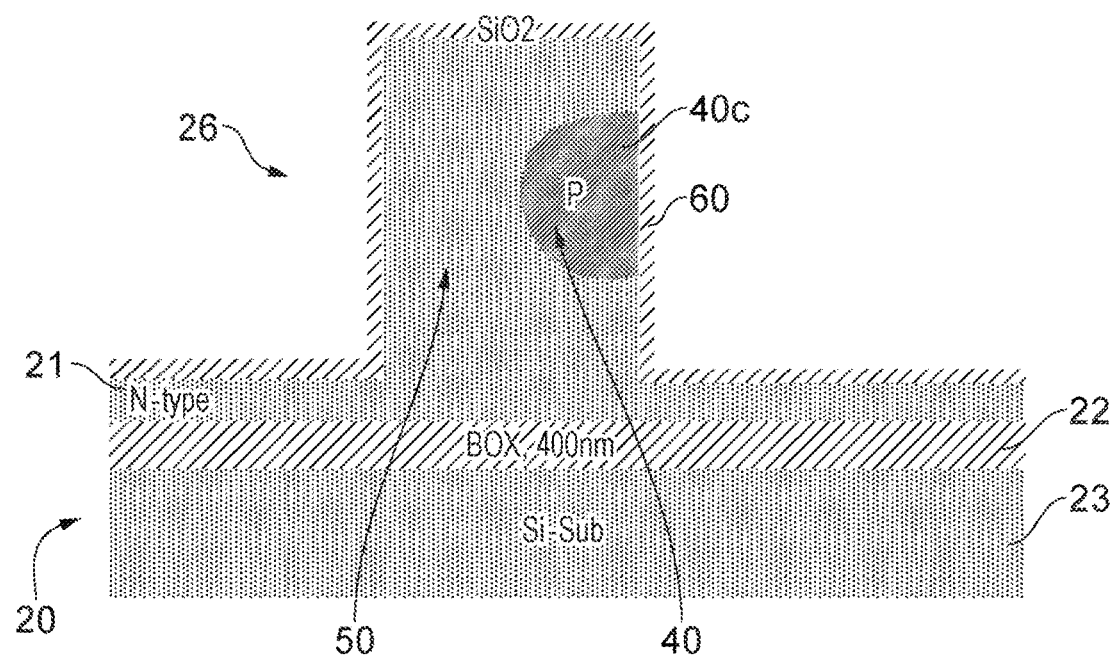

In FIG. 1j, the waveguide mask 25 is removed from the optical waveguide 26. Furthermore, a second mask layer 60 is deposited on the optical waveguide 26 and the silicon device layer 21. In this embodiment, the second mask layer 60 comprises silicon dioxide and has a thickness of 20-50 nm.

Figure 1K:
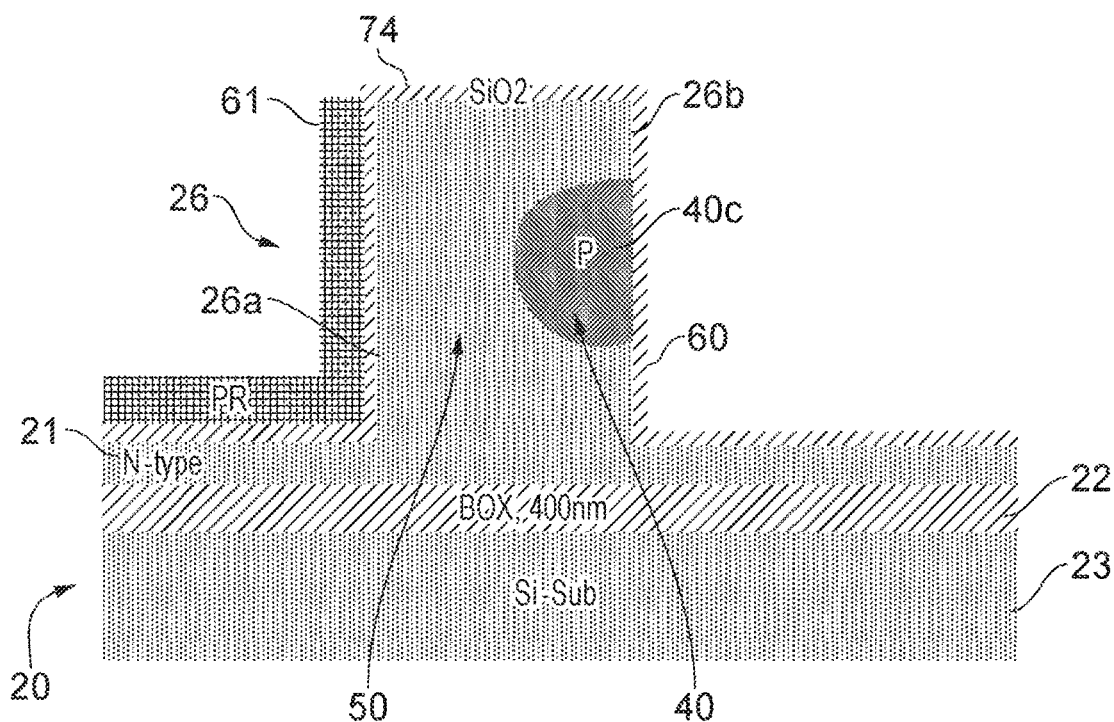

In FIG. 1k, a photoresist 61 is positioned over the second mask layer 60 to pattern a first and second portion of the first doped region 40. The photoresist 61 covers one lateral side 26a of the optical waveguide 26, but leaves a top surface 74 and the other lateral side 26b of the optical waveguide 26 exposed. Specifically the exposed lateral side 26b of the optical waveguide is the lateral side of the optical waveguide 26 from which the third portion 40c of the first doped region 40 protrudes into the second doped region 50.

Figure 1L:
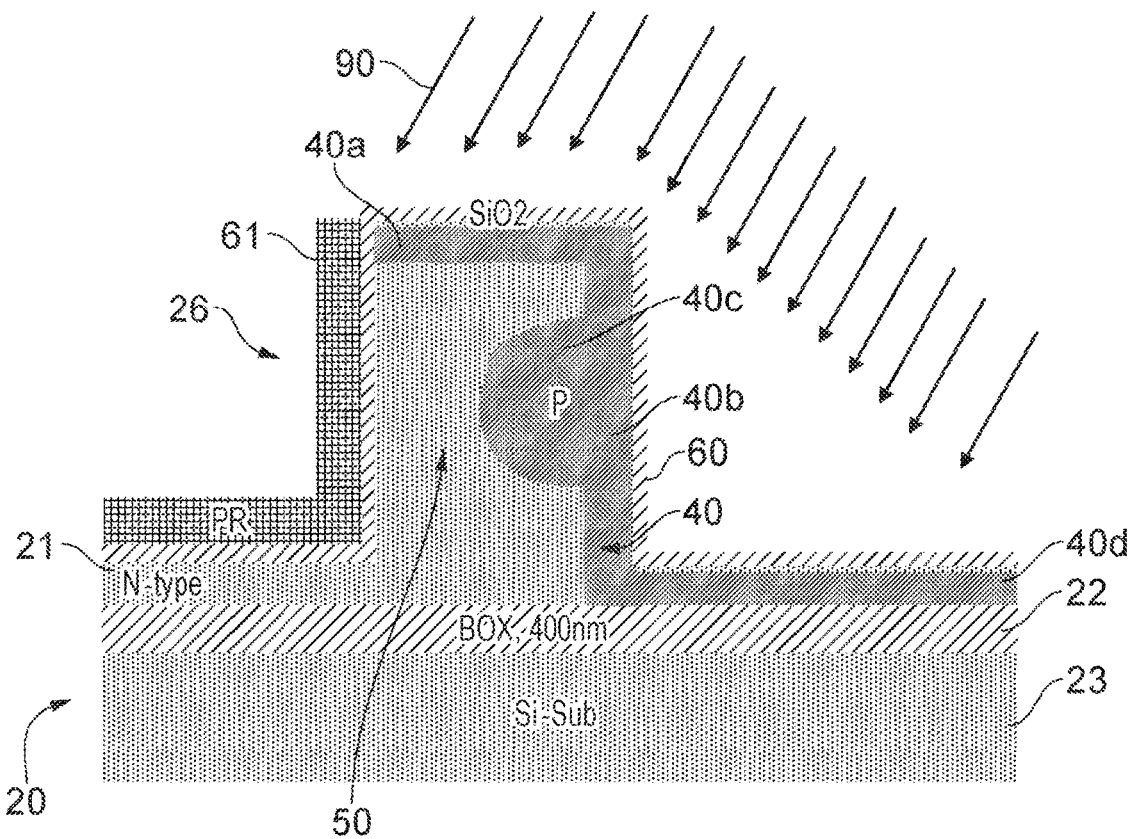

Next, as shown in FIG. 1l, boron 90 is introduced by implantation through the second mask layer 60 to the exposed top surface 74 and exposed lateral side 26b of the optical waveguide 26, thereby creating a first portion 40a and a second portion 40b of the first doped region 40. The boron implant is at an angle of approximately 45° relative to the horizontal (i.e. a direction which lies within any plane that is parallel to the plane which lies along the upper surface of the BOX layer 22). In this way, the first portion 40a of the first doped region 40 extends horizontally on top of the entire upper surface of the second doped region 50, and the second portion 40b of the first doped region 40 extends vertically along a lateral side of the second doped region 50 from an end of the first portion of the first doped region 40a to the BOX layer 22. The third portion 40c of the first doped region 40 extends horizontally from a mid-point of the second portion 40b of the first doped region 40, into the second doped region 50. Accordingly, the first, second and third portions 40a, 40b, 40c of the first doped region 40 together resemble the English letter "F" (in this figure, reversed).

The boron implantation also provides an extension 40d of the first doped region 40. The extension 40d of the first doped region 40 extends horizontally from the second portion 40b of the first doped region 40, on top of, and contiguously with, the BOX layer 22 of the SOI wafer 20.

Figure 1M:
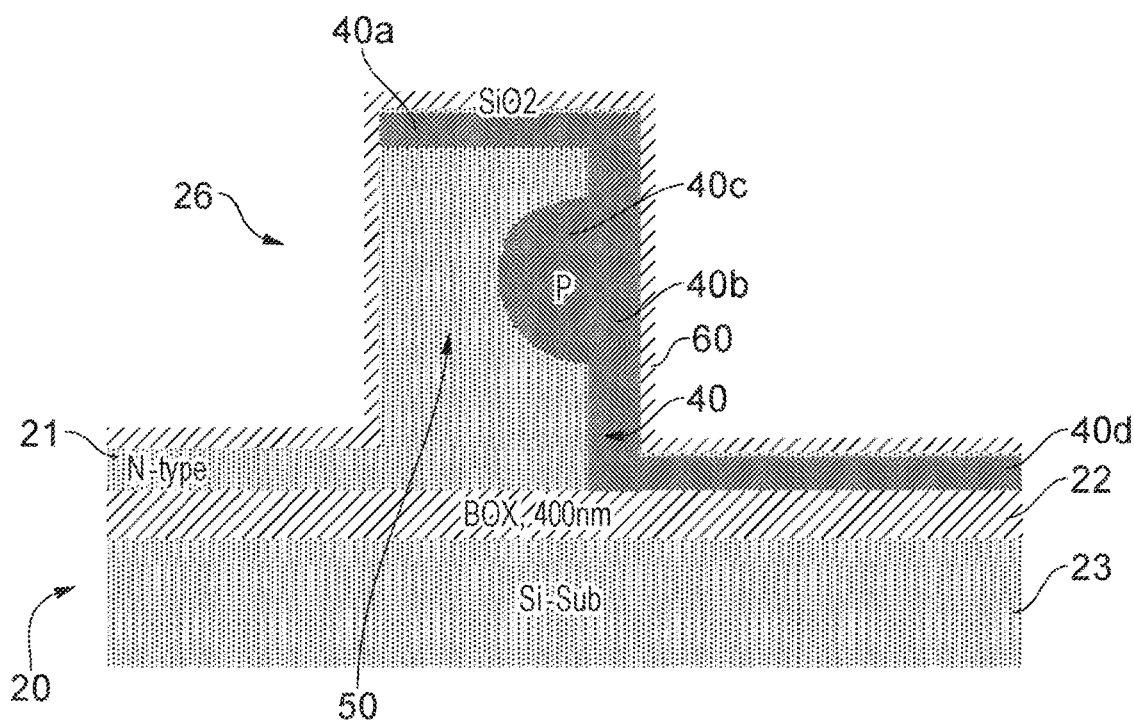

In FIG. 1m, the photoresist 61 is removed.

Figure 1N:
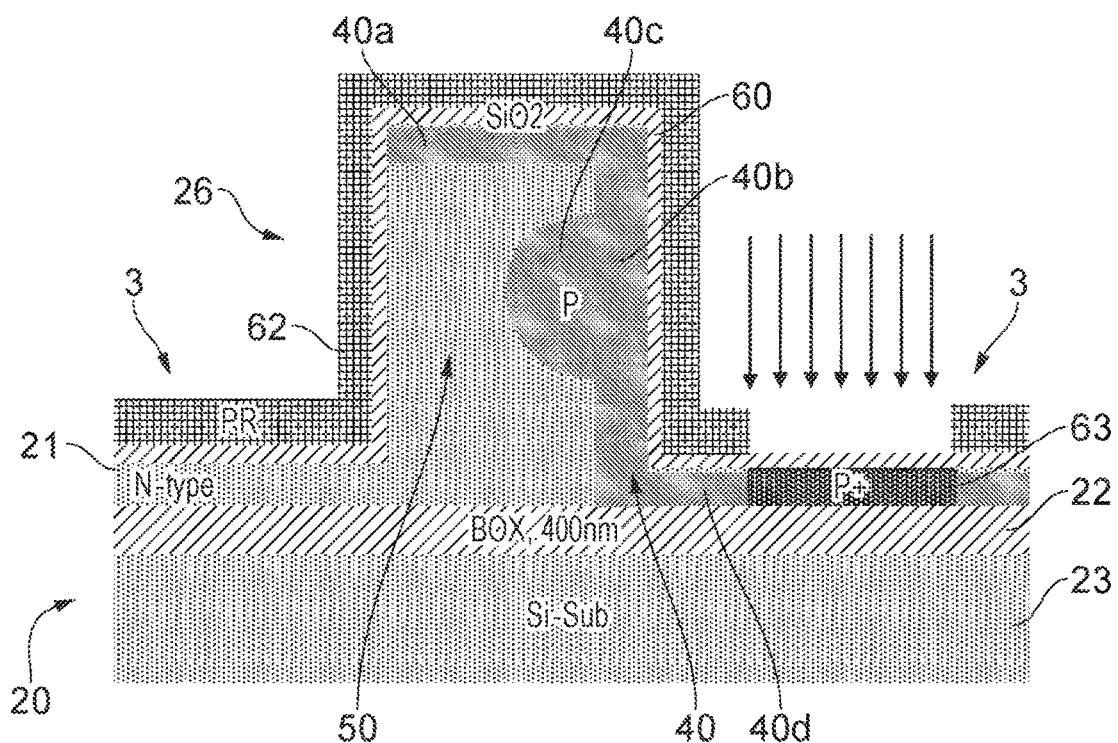

Next, as shown in FIG. 1n, a photoresist 62 is positioned over the second mask layer 60. Photoresist 62 is then patterned to define a first heavily doped region 63. Specifically, boron is implanted in the extension 40d of the first doped region 40 in order to create a p+ region (a first heavily doped region 63). The first heavily doped region 63 is formed outside of the light propagation region of the optical waveguide 26, in a slab region 3. Standard implantation techniques are used. Photoresist 62 is then removed.

Figure 1O:
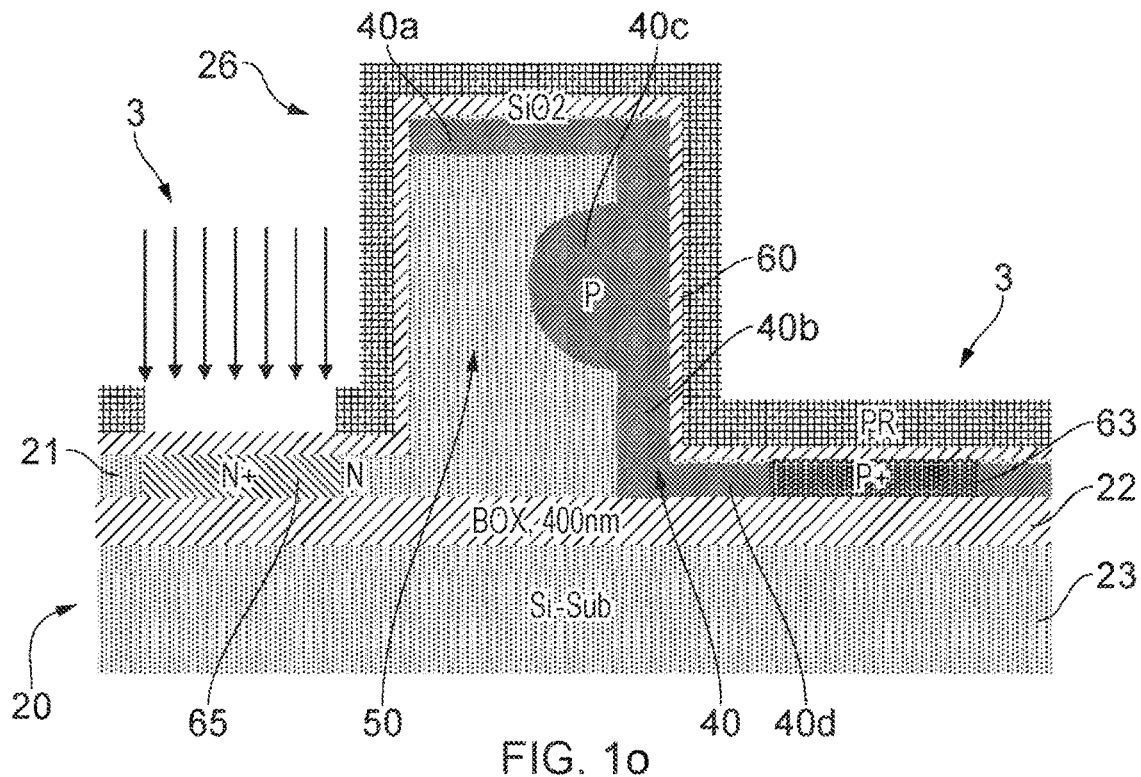
Figure 1P:
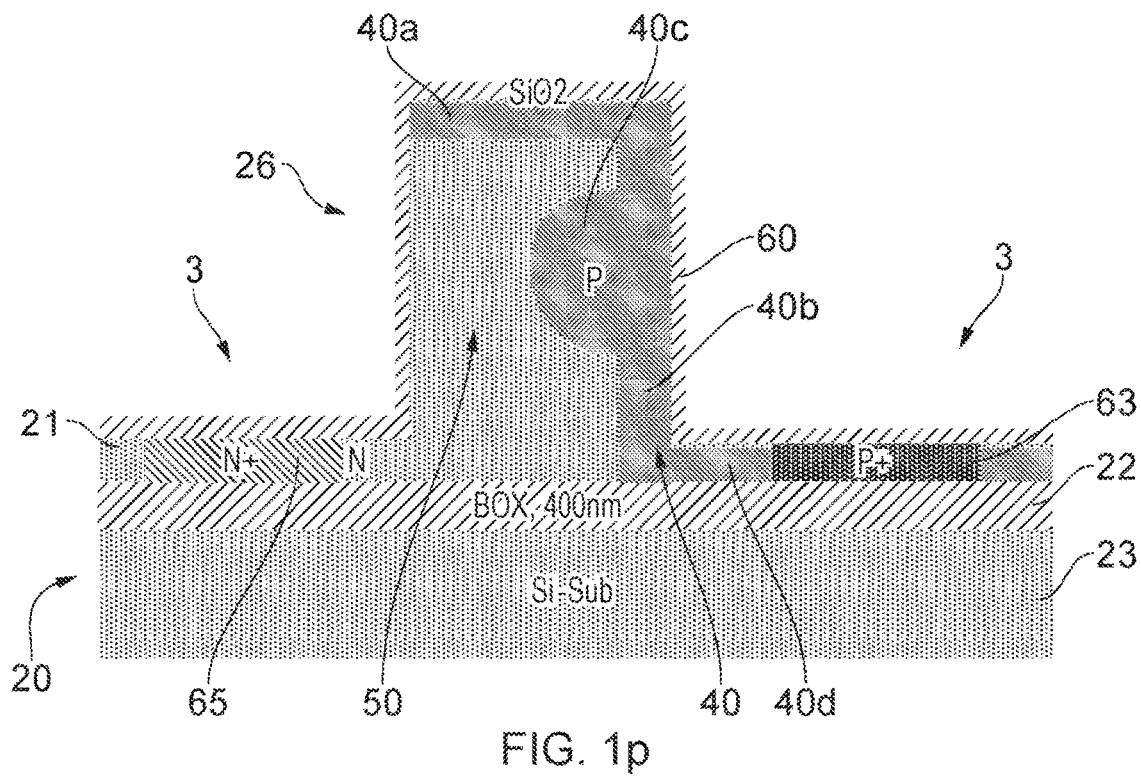

In FIG. 1o, a further photoresist 64 is positioned over the second mask layer 60 and patterned to define a second heavily doped region 65. Specifically, a second dopant (having an opposite doping type or polarity to the first dopant, but a same doping type or polarity to the silicon device layer 21) is implanted into the silicon device layer 21 of the SOI wafer 20 in an area outside of the light propagation region of the optical waveguide 26, in a slab region 3. In this embodiment, phosphorous is implanted to form an n+ region. Standard implantation techniques are used, and photoresist 64 is removed after the doping has been performed (FIG. 1p).

Next, the optoelectronic device 1 is annealed at 1050° C.-1100° C. for 10 seconds.

Passivation layer 70 is then deposited on top of the second mask layer 60. Passivation layer 70 may also function as the upper cladding layer for the waveguide 26, and the buried oxide layer 22 may function as the lower cladding layer for the waveguide 26. In the example embodiment shown in FIG. 1q, the passivation layer 70 comprises silicon dioxide and has a thickness of approximately 500 nm. The passivation layer 70 is etched at two openings 67, 68 through to the first heavily doped region 63 and the second heavily doped region 65, respectively. The openings 67, 68 are etched using standard etching techniques, using photoresist 71. The photoresist 71 is then removed.

Figure 1Q:
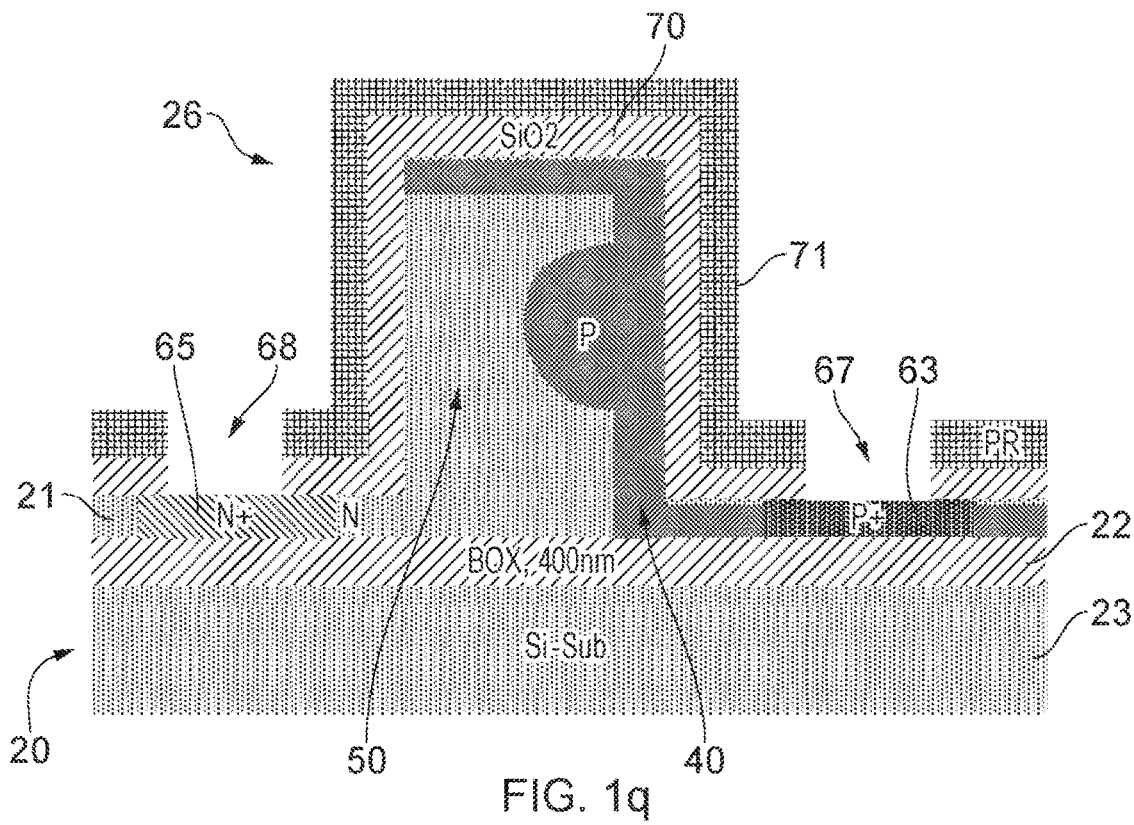
Figure 1R:
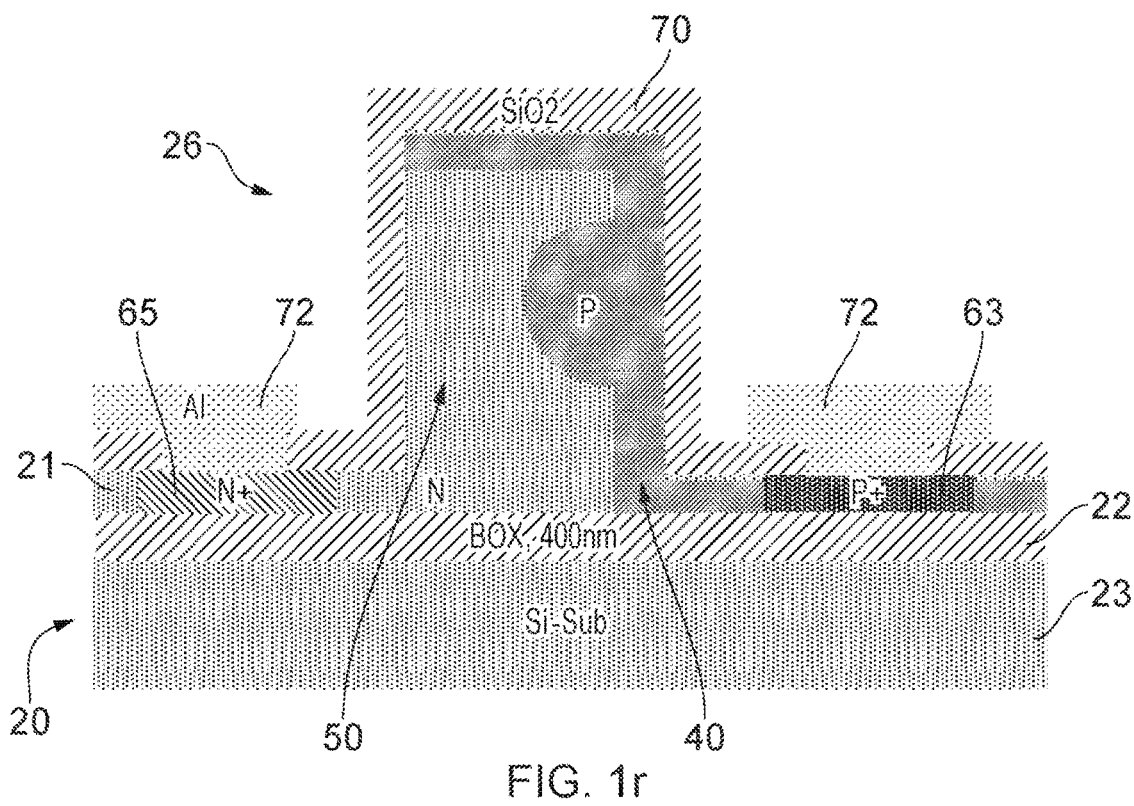

Finally, as shown in FIG. 1r, electrical contacts 72 (preferably formed of aluminium) are deposited through the passivation layer 70 to electrically connect to the first and second heavily doped regions 63, 65 respectively.

The resulting optoelectronic device 1 is shown in FIG. 2. A p-n junction is formed by the first doped region 40 and the second doped region 50. In this example embodiment, the first doped region 40 is p-type doped and the second doped region 50 is n-type doped. In alternative embodiments, the first doped region may be n-type doped and the second doped region may be p-type doped. The first doped region 40 is formed by the first portion 40a, the second portion 40b, the third portion 40c and the extension 40d. The second doped region 50 includes a first portion 50a, a second portion 50b, and a third portion 50c, which are illustrated in FIG. 2. The first portion 50a of the second doped region 50 is illustrated as being immediately below the third portion 40c of the first doped region 40 and extending vertically and continuously from the third portion 40c of the first doped region 40 to the BOX layer 22. The second portion 50b of the second doped region 50 is illustrated as being immediately above the third portion 40c of the first doped region 40 and extending vertically and continuously from the third portion 40c of the first doped region 40 to the first portion 40a of the first doped region 40. The third portion 50c of the second doped region 50 is illustrated as comprising the entire portion of the second doped region 50 that is immediately below the first portion 40a of the first doped region and that does not overlap with the third portion 40c of the first doped region 40, the first portion 50a of the second doped region 50, and the second portion 50b of the second doped region 50. The third portion 50c of the second doped region 50 is illustrated as extending vertically and continuously from the first portion 40a of the first doped region 40 to the BOX layer 22.

The first portion 40a of the first doped region 40 extends horizontally on top of the entire upper surface of the second doped region 50 in the ridge region 2 of the optoelectronic device. The second portion 40b of the first doped region 140 extends vertically along a lateral side of the second doped region 50 from the first portion 40a of the first doped region 40 to the BOX layer 22.

The third portion 40c protrudes as a salient horizontally from a point between the extremities of the second portion 40b into the second doped region 50 such that the third portion 40c is surrounded on all but one side (i.e. the side from which it extends from the second portion 40b) by the second doped region 50. The third portion 40c of the first doped region 40 therefore forms a peninsula extending into the second doped region 50 in the light propagation region of the optical waveguide 26 (i.e. the ridge portion 2). In other words, the second doped region 50 extends on top and below the third portion 40c of the first doped region 40, as well as along a lateral side of the third portion 40c of the first doped region 40. The resultant first, second and third regions of the first doped region therefore together resemble the English letter "F" (rotated 180° about the vertical).

The optoelectronic device 1 also comprises a first heavily doped region 63, which in this embodiment is p+ doped. The first heavily doped region 63 is formed outside the light propagation region of the optical waveguide 26 in a slab region 3, and the extension 40d of the first doped region 40 extends from the second portion 40b of the first doped region 40 to the first heavily doped region 63. Specifically, the extension 40d extends horizontally from the second portion 40b of the first doped region 40 to the first heavily doped region 63, on top of, and contiguously with, the BOX layer 22.

The optoelectronic device 1 also comprises a second heavily doped region 65, which in this embodiment is n+ doped. The second heavily doped region 65 is formed outside the light propagation region of the optical waveguide 26, in a different slab region 3.

Electrical contacts 72 are disposed through a passivation layer 70 to the first and second heavily doped regions 63, 65 respectively.

Figure 3A:
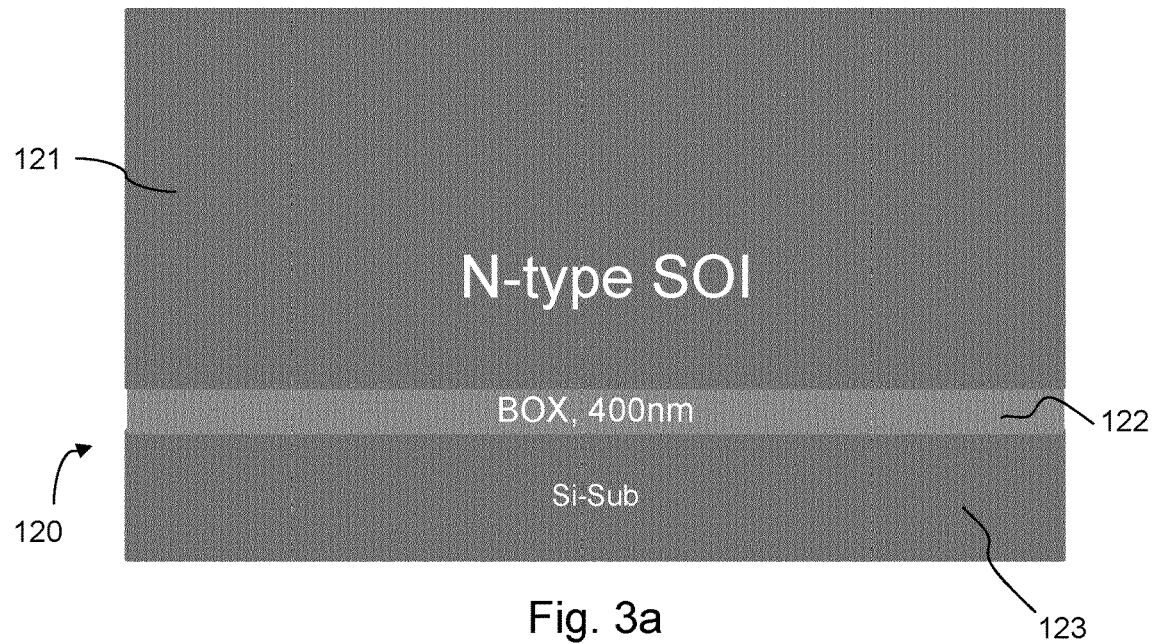
FIGS. 3a-3f depict steps of a method of manufacturing an optoelectronic device according to a second embodiment of the invention.
Figure 3B:
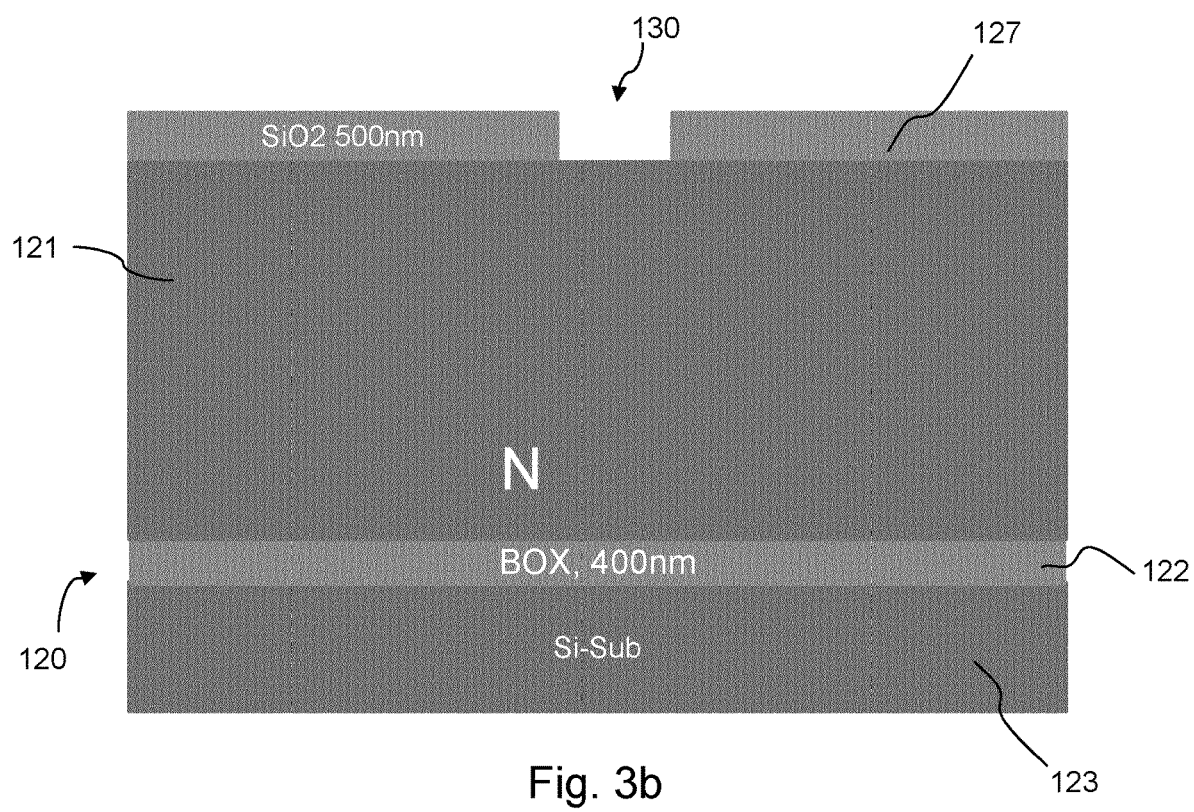
Figure 3C:
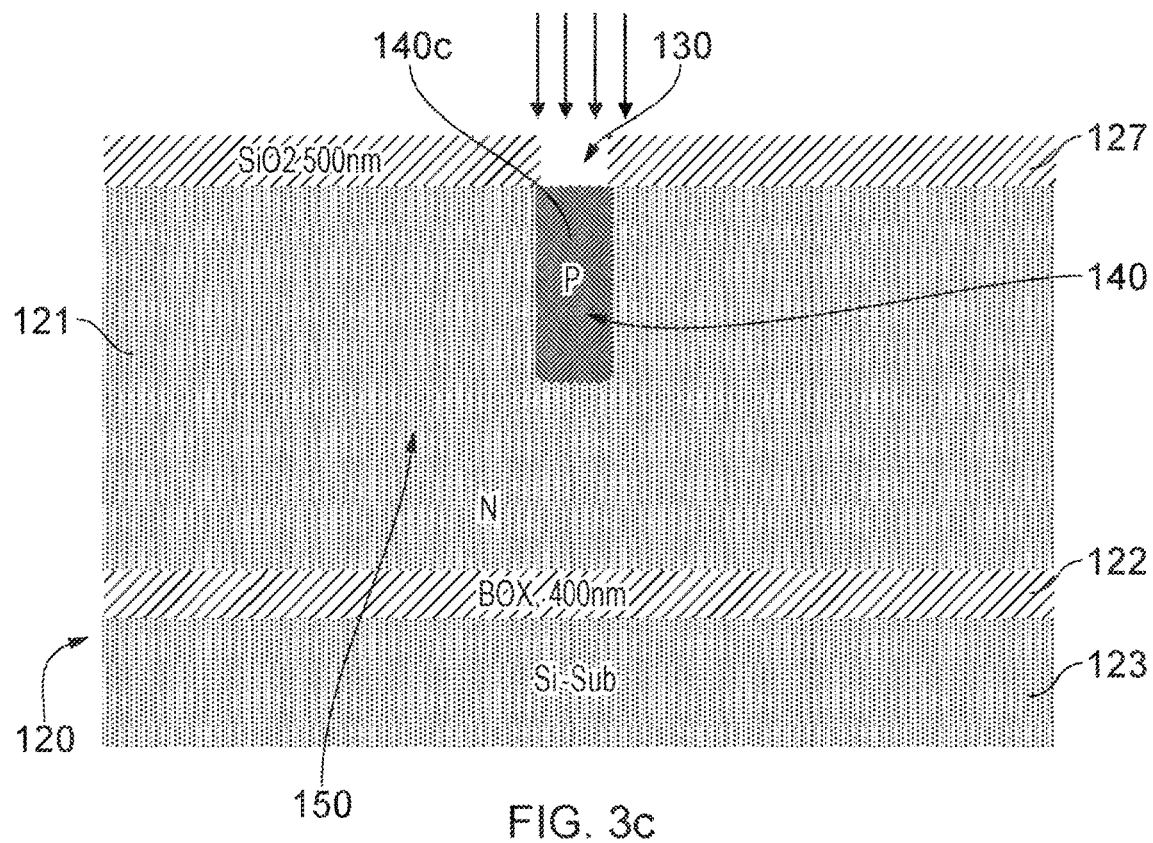
Figure 3D:
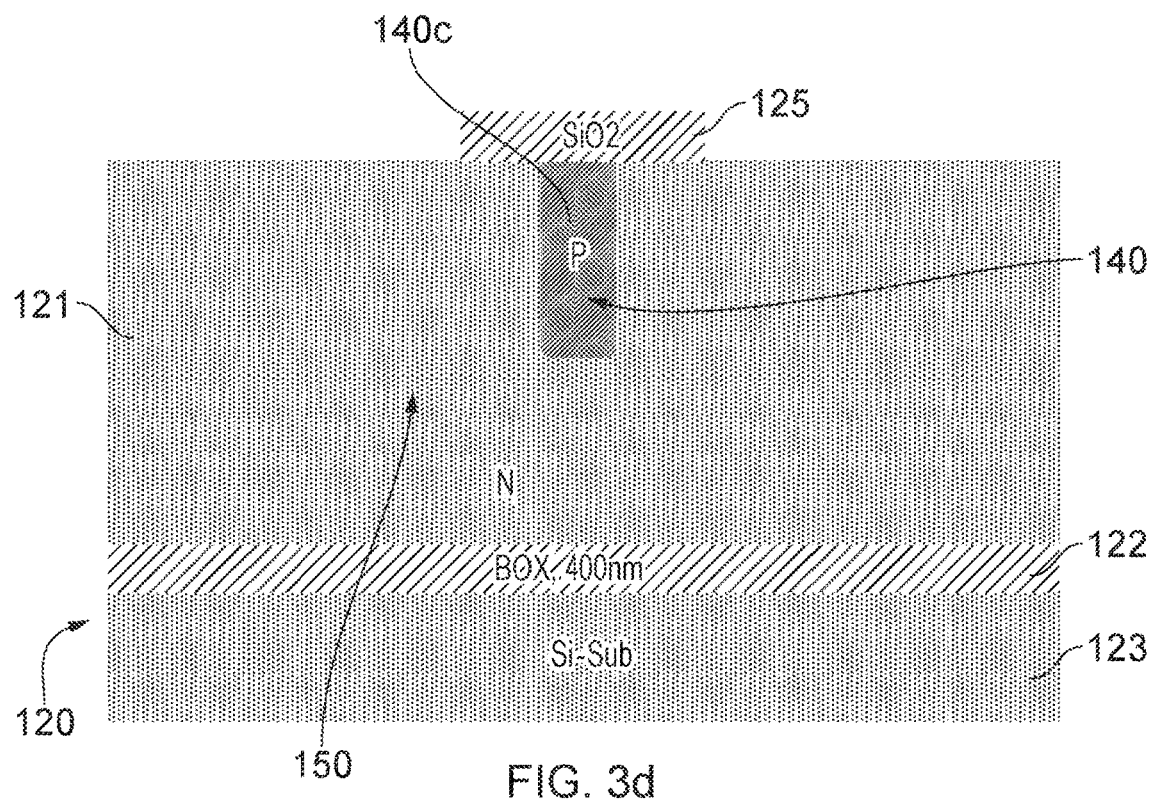
Figure 3E:
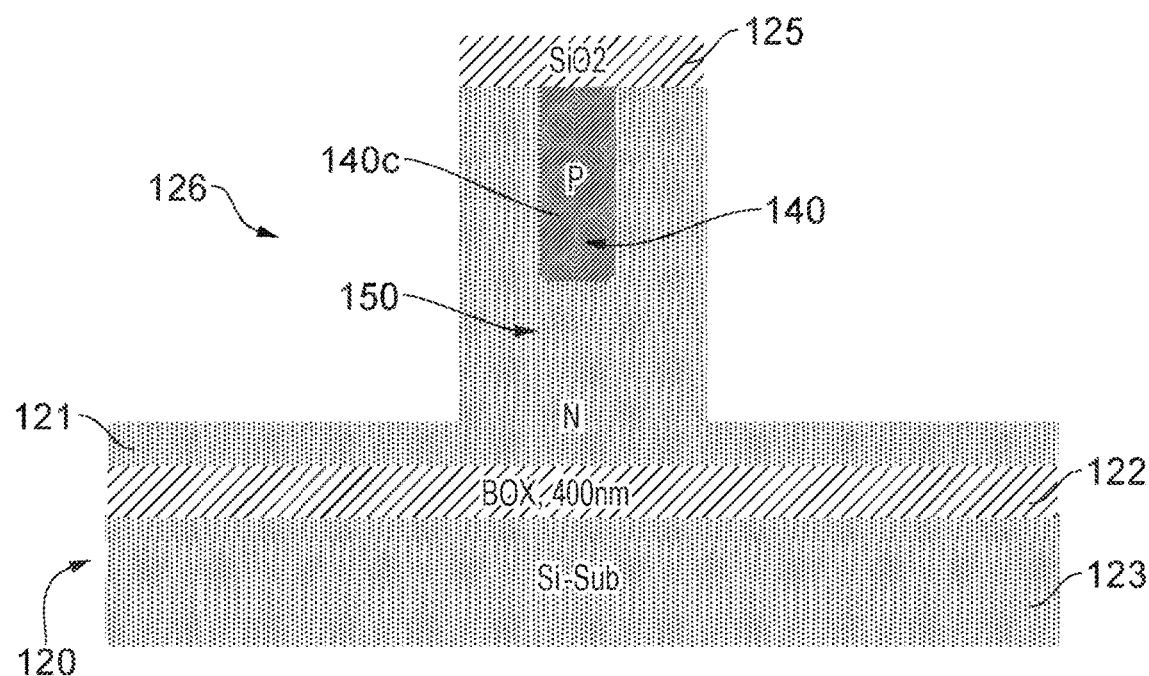
Figure 3F:
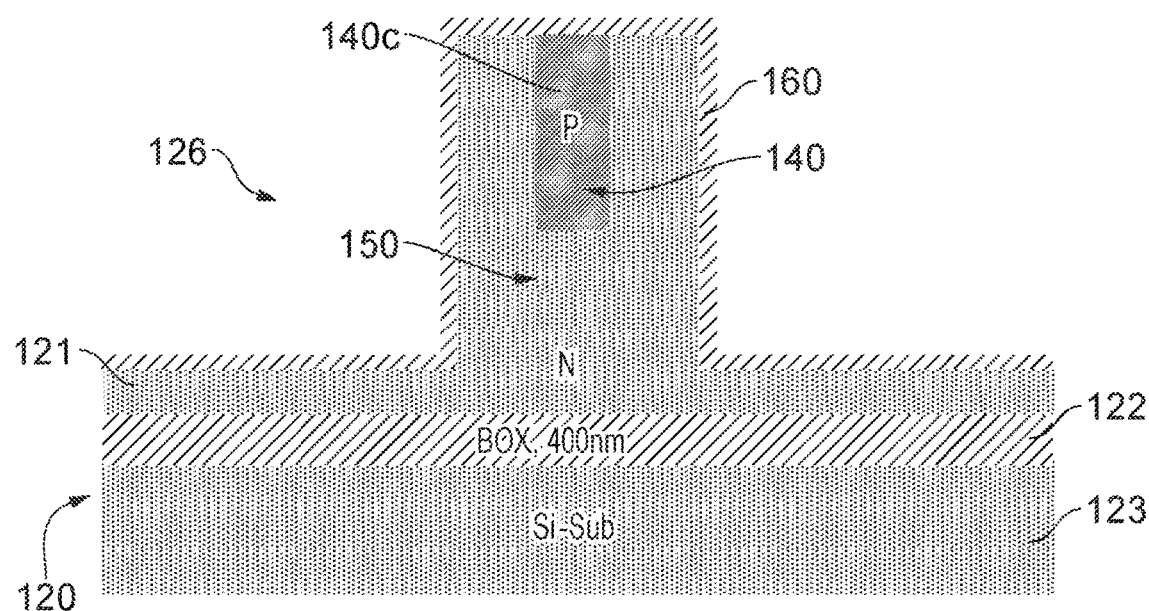
Figure 4:
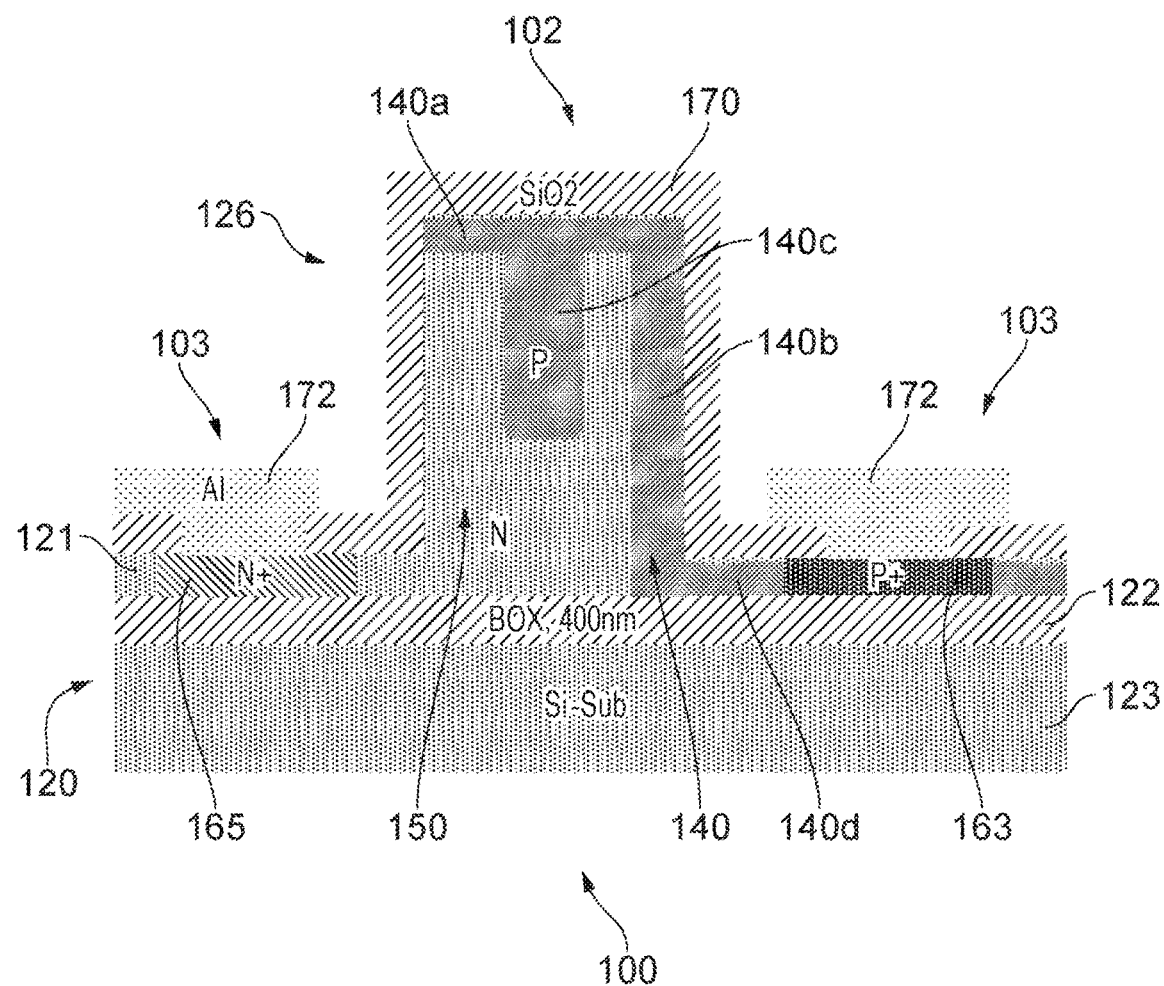
FIG. 4 is a schematic cross-section of the optoelectronic device manufactured according to the method depicted in FIGS. 3a-3f.

A method of manufacturing an optoelectronic device according to a second embodiment is described below with reference to FIGS. 3a-3f The resultant manufactured device is illustrated in FIG. 4. The manufactured optoelectronic device 100 comprises a ridge waveguide having a ridge region 102, and two laterally-extending slab regions 103. The optoelectronic device 100 comprises a SOI wafer 120.

As shown in FIG. 3a, and similarly to the step illustrated in FIG. 1a, the SOI wafer 120 is initially provided comprising a silicon substrate 123, a buried oxide (BOX) layer 122 and a silicon device layer 121 (i.e. top silicon layer). The SOI wafer 120 is a 3 µm wafer, as measured from an upper surface of the substrate 23 to an upper surface of the BOX layer 122, and the BOX layer 122 has a thickness of 400 nm. The silicon device layer 121 is n-type doped, and will form a second doped region of the p-n junction of the optoelectronic device 100. Alternatively, an undoped silicon device layer 121 can be provided, which is then doped with an n species dopant.

Next, as shown in FIG. 3b, a first mask layer 127 is deposited on the silicon device layer 121 of the SOI wafer 120. The first mask layer 127 comprises silicon dioxide and has a thickness of approximately 500 nm. An opening 130 is created in the first mask layer 127 to the silicon device layer 121. The opening 130 extends to a portion of the silicon device layer 121 which will form an optical waveguide. The opening 130 may be created using standard patterning and etching techniques. For example, a photoresist may be positioned over the first mask layer 127 and patterned to define the opening 130 through the first mask layer 127. The opening may be created by HF wet etching, and the photoresist may then be removed.

As shown in FIG. 3c, a first dopant (e.g. boron) is introduced by diffusion through the opening 130 in the first mask layer 127 to the silicon device layer 121, thereby creating the third portion 140c of a first doped region 140 as discussed above. The boron is introduced to a portion of the silicon device layer 121 which will subsequently form the optical waveguide. The first doped region 140 is p-type doped. The third portion 140c of the first doped region 140 protrudes vertically downwards from an upper surface of the silicon device layer 121 towards the BOX layer 122 of the SOI wafer 120, into a second doped region 150 which is formed by the silicon device layer 121.

In alternative embodiments, rather than introduction of the first dopant by diffusion, the first dopant may be introduced by implantation.

The first mask layer 127 is then removed. As shown in FIG. 3d, a waveguide mask 125 is then deposited on the silicon device layer 121. The waveguide mask 125 comprises silicon dioxide and has a thickness of 500 nm. The waveguide mask 125 is patterned to define the optical waveguide. Therefore, the waveguide mask 125 is deposited and a photolithography process is used to pattern the mask to define the optical waveguide. The resulting optical waveguide comprises the third portion 140c of the first doped region 140. Standard deposition techniques are used.

Next, as shown in FIG. 3e, a waveguide 126 is etched in the silicon device layer 121. The waveguide 126 may be etched using standard patterning and etching techniques to etch the waveguide 126 to its full depth.

In FIG. 3f, the waveguide mask 125 is removed from the optical waveguide 126, and a second mask layer 160 is deposited on the optical waveguide 126 and the silicon device layer 121. In this example embodiment, the second mask layer 160 comprises silicon dioxide and has a thickness of 20-50 nm.

The remaining steps of this alternative method of manufacture are the same as those described above with reference to the first embodiment and FIGS. 1k-1r, except for that the third portion 140c of the first doped region 140 extends vertically into the second doped region 150, rather than horizontally into the second doped region 150.

Accordingly, a photoresist is then positioned over the second mask layer 160 to pattern a first and second portion 140a, 140b of the first doped region 140. The first and second portions 140a, 140b of the first doped region 140 are shown in FIG. 4. The photoresist covers one lateral side of the optical waveguide 126, but leaves a top surface and the other lateral side of the optical waveguide exposed.

Boron is introduced by implantation through the second mask layer 160 at the exposed top surface and exposed lateral side of the optical waveguide 126, thereby creating the first portion 140a and the second portion 140b of the first doped region 140. The boron implant is at an angle of approximately 45° relative to the horizontal (i.e. a direction which lies within any plane that is parallel to the plane which lies along the upper surface of the BOX layer 122). In this way, the first portion 140a of the first doped region 140 extends horizontally on top of the entire surface of the second doped region 150, and the second portion 140b of the first doped region 140 extends vertically along a lateral side of the second doped region 150 from an end of the first portion 140a of the first doped region 140 to the BOX layer 122. The third portion 140c of the first doped region 140 extends vertically downwards (i.e. towards the BOX layer 122) from the first portion 140a of the first doped region 140, into the second doped region 150. Accordingly, the first, second and third portions 140a, 140b, 140c of the first doped region resemble the English letter "F" (rotated) 90°.

The boron implantation also provides an extension 140d (shown in FIG. 4) of the first doped region 140. The extension 140d of the first doped region 140 extends horizontally from the second portion 140b of the first doped region 140, on top of, and contiguously with, the BOX layer 122 of the SOI wafer 120. The photoresist is then removed.

Similarly to the step shown in FIG. 1n, a further photoresist is then positioned over the second mask layer 160. This photoresist is then patterned to define a first heavily doped region 163. Specifically, boron is implanted in the extension 140d of the first doped region 140 in order to create a p+ region (a first heavily doped region 163). The first heavily doped region 163 is formed outside of a light propagation region of the optical waveguide 126, in a slab region 103. Standard implantation techniques are used and the photoresist is then removed.

Similarly to the step shown in FIG. 1o, a further photoresist is then positioned over the second mask layer 160 and patterned to define a second heavily doped region 165. A second dopant (having an opposite doping type or polarity to the first dopant, but a same doping type or polarity to the silicon device layer 121) is implanted into the silicon device layer 121 of the SOI wafer 120 in an area outside of the light propagation region of the optical waveguide 126 (in a slab region 103). In this example embodiment, phosphorous is implanted to form an n+ region. Standard implantation techniques are used and the photoresist is then removed after the doping has been performed.

The optoelectronic device 100 is then annealed at 1050° C.–1100° C. for 10 seconds.

Similarly to the step shown in FIG. 1q, a passivation layer 170 is then deposited on top of the second mask layer 160. In the example embodiment shown in FIG. 1q, the passivation layer 170 comprises silicon dioxide and has a thickness of approximately 500 nm. The passivation layer 170 is etched at two openings through to the first heavily doped region 163 and the second heavily doped region 165, respectively. The openings 167, 168 are etched using standard etching techniques, using a photoresist.

Finally, similarly to the step shown in FIG. 1r, electrical contacts 172 (preferably formed from aluminium) are deposited through the passivation layer 170 to electrically connect to the first and second heavily doped regions 163, 165, respectively.

The resulting optoelectronic device 100 is shown in FIG. 4. A p-n junction is formed by the first doped region 140 and the second doped region 150. In this example embodiment, the first doped region 140 is p-type doped and the second doped region 150 is n-type doped, although in alternative embodiments, the first doped region may be n-type doped region and the second doped region is p-type doped. The first doped region 140 is formed by the first portion 140a, the second portion 140b, the third portion 140c and the extension 140d.

The first portion 140a of the first doped region 140 extends horizontally on top of the entire upper surface of the second doped region 150, and the second portion 140b of the first doped region 140 extends vertically along a lateral side of the second doped region 150 from the first portion 140a of the first doped region 140 to the BOX layer 122.

The third portion 140c protrudes as a salient vertically from a point between the extremities of the first portion 140a into the second doped region 150 such that the third portion 140c is surrounded on all but one side (i.e. the side from which it extends from the first portion 140a) by the second doped region 150. The third portion 140c of the first doped region 140 therefore forms a peninsula extending into the second doped region 150 in the light propagation region of the optical waveguide 126. In other words, the second doped region 150 extends below the third portion 140c of the first doped region 140, and on both lateral sides of the vertically extending third portion 140c of the first doped region 140. The resultant first, second and third regions of the first doped region therefore together resemble the English letter "F" (rotated 90°).

The optoelectronic device 100 also comprises a first heavily doped region 163, which in this embodiment is p+ doped. The first heavily doped region 163 is formed outside the light propagation region of the optical waveguide 126 in a slab region 103 and the extension 140d of the first doped region 140 extends from the second portion 140b of the first doped region 140 to the first heavily doped region 163. Specifically, the extension 140d extends horizontally from the second portion 140b of the first doped region 140 to the first heavily doped region 163, on top of, and contiguously with, the BOX layer 122.

The optoelectronic device 100 also comprises a second heavily doped region 165, which in this embodiment is n+ doped. The second heavily doped region 165 is formed outside the light propagation region of the optical waveguide 126, in a different slab region 103.

Electrical contacts 172 are disposed through a passivation layer 170 to the first and second heavily doped regions 163, 165 respectively.

Figure 5A:
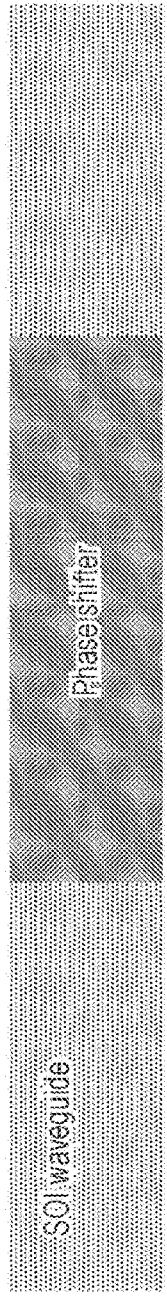
FIGS. 5a and 5b illustrate possible applications of the optoelectronic device of FIG. 2 or FIG. 4.

FIG. 5a illustrates a phase shifter, which is a possible application of the optoelectronic device 1, 100 of FIG. 2 and FIG. 4, respectively. The phase of light travelling through the optical waveguide 26, 126 of optoelectronic device 1, 100 can be modulated using the phase shifter.

Figure 5B:
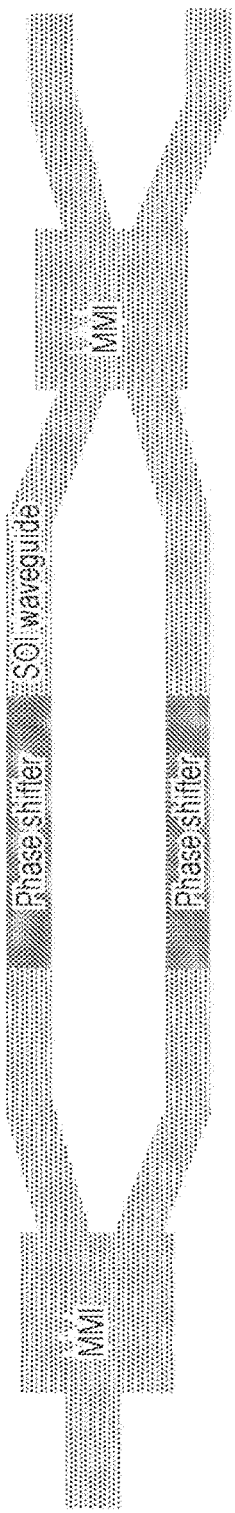

FIG. 5b illustrates another possible application of the optoelectronic device 1, 100 of FIG. 2 and FIG. 4 respectively. Specifically, FIG. 5b illustrates a phase modulator (an optical modulator), implemented by a Mach-Zehnder interferometer, including two multimode interference (MMI) couplers/splitters.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

What is claimed is:

1. An optoelectronic device comprising:
    a silicon-on-insulator wafer, comprising a substrate, a buried oxide (BOX) layer above the substrate, and a silicon device layer above the BOX layer;
    an optical waveguide formed in the silicon device layer and including a semiconductor junction comprising:
        a first doped region of semiconductor material; and
        a second doped region of semiconductor material, the second doped region of semiconductor material containing dopants of a different species to the first doped region of semiconductor material, wherein:
    a first portion of the first doped region of semiconductor material extends horizontally on top of the second doped region of semiconductor material and across the entire width of the waveguide, the first portion of the first doped region defining a top surface of the waveguide;
    a second portion of the first doped region of semiconductor material extends vertically along a lateral side of the second doped region of semiconductor material;
    a third portion of the first doped region of semiconductor material protrudes horizontally as a rounded salient from a mid-point of the second portion of the first doped region of semiconductor material into the second doped region of semiconductor material, the third portion of the first doped region having a hemi-cylindrical geometry and extending only to halfway across the width of the waveguide;
    a first portion of the second doped region of semiconductor material immediately below the third portion of the first doped region extends vertically and continuously from the third portion of the first doped region to the BOX layer, the entire first portion of the second doped region being vertically between the third portion of the first doped region and the BOX layer, and no portion of the first doped region being vertically between the third portion of the first doped region and the BOX layer;
    a second portion of the second doped region of semiconductor material immediately above the third portion of the first doped region extends vertically and continuously from the third portion of the first doped region to the first portion of the first doped region, the entire second portion of the second doped region being vertically between the third portion of the first doped region and the first portion of the first doped region; and
    a third portion of the second doped region of semiconductor material comprises the entire portion of the second doped region that is immediately below the first portion of the first doped region and that is not overlapping with the third portion of the first doped region, the first portion of the second doped region, and the second portion of the second doped region, the third portion of the second doped region extending vertically and continuously from the first portion of the first doped region to the BOX layer.

2. The optoelectronic device according to claim 1, further comprising a first heavily doped region, and a second heavily doped region, wherein the first heavily doped region and second heavily doped region are formed outside of a light propagation region of the optical waveguide, and wherein the first heavily doped region contains dopants of the same species as the first doped region of semiconductor material, and the second heavily doped region contains dopants of the same species as the second doped region of semiconductor material.

3. The optoelectronic device according to claim 2, wherein an extension of the first doped region of semiconductor material extends from the light propagation region of the optical waveguide to the first heavily doped region, and an extension of the second doped region of semiconductor material extends from the light propagation region of the optical waveguide to the second heavily doped region.

4. The optoelectronic device according to claim 2, wherein the optoelectronic device further comprises a first electrical contact electrically connected to the first heavily doped region, and a second electrical contact electrically connected to the second heavily doped region.

5. A method of manufacturing the optoelectronic device of claim 1,
    wherein the method comprises the steps of:

creating the first portion of the first doped region of semiconductor material;
creating the second portion of the first doped region of semiconductor material; and
creating the third portion of the first doped region of semiconductor material.

6. The method according to claim 5, wherein the step of creating the third portion of the first doped region of semiconductor material comprises:
depositing a first mask layer on the silicon device layer;
creating an opening in the first mask layer to the silicon device layer; and
introducing a first dopant to the silicon device layer through the opening in the first mask layer.

7. The method according to claim 6, wherein, to create the third portion of the first doped region of semiconductor material, the first dopant is introduced to the optical waveguide through the opening in the first mask layer by diffusion of the first dopant.

8. The method according to claim 6, wherein the first dopant is boron.

9. The method according to claim 6, wherein the steps of creating the first portion of the first doped region of semiconductor material and the second portion of the first doped region of semiconductor material comprises:
depositing a second mask layer on the optical waveguide; and
introducing the first dopant to the optical waveguide through the second mask layer.

10. The method according to claim 9, wherein, to create the first portion of the first doped region of semiconductor material and the second portion of the first doped region of semiconductor material, the first dopant is introduced to the optical waveguide through the second mask layer by implantation of the first dopant at less than 90° relative to the horizontal.

11. The method according to claim 6, wherein the method further comprises:
creating a first heavily doped region outside of a light propagation region of the optical waveguide, the first heavily doped region containing dopants of the same species as the first doped region of semiconductor material; and
creating a second heavily doped region outside of the light propagation region of the optical waveguide, the second heavily doped region containing dopants of the same species as the second doped region of semiconductor material.

12. The method according to claim 11, wherein the step of creating the first heavily doped region comprises introducing the first dopant to a region of the silicon device layer of the silicon-on-insulator wafer outside of the light propagation region of the optical waveguide.

13. The method according to claim 12, wherein, in the step of creating the first heavily doped region, the first dopant is introduced by implantation of the first dopant.

14. The method according to claim 11, wherein the step of creating the second heavily doped region comprises introducing a second dopant to a region of the silicon device layer of the silicon-on-insulator wafer outside of the light propagation region of the optical waveguide, the second dopant having an opposite doping type to the first dopant.

15. The method according to claim 11, further comprising:
depositing a passivation layer on the optical waveguide;
applying a first electrical contact through the passivation layer to the first heavily doped region; and
applying a second electrical contact through the passivation layer to the second heavily doped region.

16. The method according claim 5, wherein the method further comprises:
depositing a waveguide mask layer on the silicon device layer of the silicon-on-insulator wafer; and
etching a portion of the silicon device layer of the silicon-on-insulator wafer to form the optical waveguide.

17. The method according to claim 5, wherein the silicon device layer of the silicon-on-insulator wafer contains dopants of a different species to the first doped region of semiconductor material, and the silicon device layer of the silicon-on-insulator wafer provides the second doped region of semiconductor material.

18. A Mach-Zehnder interferometer, usable as an electro-optic modulator, the interferometer including a pair of waveguides, each waveguide containing the optoelectronic device of claim 1.

* * * * *